(12) United States Patent
Kawakami et al.

(10) Patent No.: US 7,208,816 B2
(45) Date of Patent: Apr. 24, 2007

(54) ELECTRONIC CIRCUIT DEVICE AND MANUFACTURING METHOD THEREOF

(75) Inventors: Kazuhiko Kawakami, Hitachinaka (JP); Noriyoshi Urushiwara, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 109 days.

(21) Appl. No.: 10/640,639

(22) Filed: Aug. 14, 2003

(65) Prior Publication Data

US 2004/0084756 A1    May 6, 2004

(30) Foreign Application Priority Data

Sep. 24, 2002   (JP) .............................. 2002-277380

(51) Int. Cl.
*H01L 23/495* (2006.01)

(52) U.S. Cl. ..................................... 257/666
(58) Field of Classification Search ........ 257/666–678, 257/99–100, 691
See application file for complete search history.

(56) References Cited

U.S. PATENT DOCUMENTS

| | | | | |
|---|---|---|---|---|
| 5,406,699 | A * | 4/1995 | Oyama | 29/827 |
| 5,905,299 | A | 5/1999 | Lacap | |
| 6,025,650 | A | 2/2000 | Tsuji et al. | |
| 6,271,583 | B1 | 8/2001 | Sakoda et al. | |
| 6,307,272 | B1 * | 10/2001 | Takahashi et al. | 257/787 |
| 6,396,130 | B1 * | 5/2002 | Crowley et al. | 257/666 |
| 6,646,331 | B2 * | 11/2003 | Sakamoto et al. | 257/678 |
| 6,730,995 | B2 * | 5/2004 | Bolken | 257/679 |
| 6,847,112 | B2 * | 1/2005 | Ito | 257/712 |
| 2002/0117750 | A1 * | 8/2002 | Kojima et al. | 257/724 |
| 2002/0180008 | A1 * | 12/2002 | Corisis | 257/666 |
| 2003/0201520 | A1 * | 10/2003 | Knapp et al. | 257/666 |
| 2004/0099931 | A1 * | 5/2004 | Huang et al. | 257/666 |
| 2004/0129452 | A1 * | 7/2004 | Owens | 174/260 |
| 2005/0040515 | A1 * | 2/2005 | Inoue et al. | 257/706 |

FOREIGN PATENT DOCUMENTS

| | | |
|---|---|---|
| EP | 1024532 A2 | 8/2000 |
| JP | 01-205556 | 8/1989 |
| JP | 06-061372 | 3/1994 |
| JP | 07-240493 | 9/1995 |
| JP | 09-307026 | 11/1997 |

OTHER PUBLICATIONS

German office action dated Apr. 21, 2006 with English translation.

* cited by examiner

*Primary Examiner*—Nathan W. Ha
(74) *Attorney, Agent, or Firm*—Crowell & Moring LLP

(57) ABSTRACT

The manufacturing method for an electronic circuit device comprises attaching an electronic circuit assembly including a circuit substrate with electronic circuit elements attached to a base, joining lead terminals integrally with the base via frames before molding the lead terminals composed of a different material from that of the base with mold resin, electrically connecting the lead terminals to the electronic circuit assembly, molding the electronic circuit assembly, lead terminals, and flange with mold resin in a batch partially excluding the flange and lead terminals installed on the base, and separating and removing the frames from the lead terminals and base after the molding with the mold resin.

1 Claim, 37 Drawing Sheets

CROSS SECTIONAL VIEW ALONG THE LINE I - I

CROSS SECTIONAL VIEW ALONG THE LINE II - II

CROSS SECTIONAL VIEW ALONG THE LINE III-III

T2=T3=T1/2

CROSS SECTIONAL VIEW ALONG THE LINE V - V

CROSS SECTIONAL VIEW ALONG THE LINE VI - VI

CROSS SECTIONAL VIEW ALONG THE LINE VIII–VIII

CROSS SECTIONAL VIEW ALONG THE LINE IX−IX

CROSS SECTIONAL VIEW ALONG THE LINE X-X

CROSS SECTIONAL VIEW ALONG THE LINE XI-XI

CROSS SECTIONAL VIEW ALONG THE LINE XII–XII

CROSS SECTIONAL VIEW ALONG THE LINE XIII–XIII

CROSS SECTIONAL VIEW ALONG THE LINE XIV–XIV

NO. OF CYCLES OF THE HEAT SHOCK TEST

ELECTRONIC CIRCUIT DEVICE AND MANUFACTURING METHOD THEREOF

BACKGROUND OF THE INVENTION

The present invention relates to an electronic circuit device and a manufacturing method therefor and more particularly to an electronic circuit device which is mounted in an engine room or a transmission of a car and controls an engine and an automatic speed regulator.

The method for controlling an automatic speed regulator of a car by an electronic circuit is widely adopted and there are various mounting structures of such an electronic circuit available. An electronic circuit device with a transmission directly attached is selectively installed in a location free of damage to the electronic circuit due to entering of water and oil and is structured so as to prevent them from entering.

As an example of the structure, an electronic circuit substrate is mounted on a metallic base, and the base and a cover are joined by resistance welding or laser welding, and the electronic circuit device is air-tightly sealed and charged with inert gas such as nitrogen. This is known as a hermetic seal structure.

In this structure, the input-output terminal of the electronic circuit is pulled out from a through-hole formed in the base and the through-hole is sealed by glass having a high insulation resistance. Therefore, it is necessary to select optimal linear expansion coefficients of the base, glass, and terminal.

Namely, the reason is that when glass is fused at a high temperature such as several hundreds° C. to 1000° C. and returned to normal temperature, between the aforementioned three parts, residual compressive stress must be mutually acted.

The materials of these parts are limited and for example, when soda barium glass is used as a sealing medium, the base material is a steel plate and the terminal is composed of a combination of iron and nickel alloy (50% of iron and 50% of nickel). Therefore, the following problems are imposed.

(1) Oxidation prevention at high temperature is necessary and the base requires nickel plating having a high fusion temperature.

(2) For welding, the cover combination material is limited and the same steel plate as the base is used. When many heating elements are used in the electronic circuit, to facilitate heat dissipation, aluminum or copper is suitable for the base material. However, as mentioned above, a steel plate must be used and the heat dissipation of the steel plate is bad.

(3) In resistance welding, in order to make the electric contact resistance between the base and the cover uniform, the flatness accuracy of the two must be increased, so that there are some factors of increasing the cost.

(4) In laser welding, the welding is adversely affected by variations in the nickel plating thickness of the base and the bead of the welded part is exposed. Protective coating for preventing corrosion generation due to it is required.

(5) It is difficult to surely decide acceptance or rejection of welding from appearance and to confirm the air-tightness, the checking method using helium gas and the bubble leak checking method for checking for generation of air bubbles in an inert fluid are required.

To improve the aforementioned respects, a packaging art for adhering a circuit substrate with electronic circuit elements loaded to a base manufactured with a heat conductive material and by exposing one side of the base, sealing the circuit substrate and base with epoxy resin (mold resin) is proposed.

However, in the structure that silicone chips are used as electronic circuit elements, and a glass-ceramic substrate having a linear expansion coefficient close to that of the silicone chips is used as a circuit substrate, and these members are sealed with epoxy resin, there is a problem imposed as indicated below.

Namely, in the epoxy resin mold process (transfer mold process) of embedding the circuit substrate and base, during cooling of the mold resin (epoxy resin) after taking out it from the mold after the curing process, due to cure shrinkage of the epoxy resin and the difference in linear expansion coefficient from the substrate and base, on the boundary surfaces between the epoxy resin and the circuit substrate and base, separation or resin cracking is easily generated.

The equivalent linear expansion coefficient of epoxy resin during molding is larger than that of the base and the linear expansion coefficient of the circuit substrate is smaller than that of the base. Therefore, the circuit substrate and base are warped due to the shrinkage stress of the epoxy resin closely adhered to the circuit substrate, and the part of the epoxy resin not closely adhered or the part of weak adhesive force is applied with tensile stress, and the boundary surface is separated.

Further, the equivalent linear expansion coefficient of epoxy resin is composition of chemical shrinkage of the mold resin when it is cured in the mold, the linear expansion coefficient $\alpha 2$ between the molding temperature and the glass transition point Tg in the course of cooling to the room temperature after taking out from the mold, and the linear expansion coefficient $\alpha 1$ between the glass transition point Tg and the room temperature and it is a value about 4 times of the linear expansion coefficient at normal temperature.

To eliminate this separation, for example, when an adhesive film forming process is performed on the end face of the base, a problem arises that epoxy resin in the neighborhood of the boundary surface is cracked.

As a countermeasure therefor, use of epoxy resin having little cure shrinkage and a small linear expansion coefficient or performing of a flexible resin coating process of absorbing the difference in linear expansion coefficient on the base end face may be considered. However, in both cases, an increase in cost is unavoidable, thus an inexpensive structure is desired.

Further, in the prior arts, for example, there are a method, as described in Japanese Application Patent Laid-open Publication No. Hei 07-240493, for loading semiconductor elements on a lead frame and embedding and packaging these parts in mold resin and a method, as described in Japanese Laid-open Patent Publication No. Hei 01-205556, for packaging an IC chip, mounting members thereof, and a heat radiation board. These prior arts are not intended to package not only the electronic circuit substrate but also the base thereof in mold resin.

Further, as described in Japanese Application Patent Laid-open Publication No. Hei 06-61372 and Japanese Laid-open Patent Publication No. Hei 09-307026, a method for loading semiconductor elements on a substrate and sealing them with resin is available. However, for application of it to an art for sealing and mounting not only an electronic circuit substrate having a far larger area but also a base with one mold resin, there is a very big problem caused.

SUMMARY OF THE INVENTION

As described above, due to the magnitude of the areas of the circuit substrate and base, the shrinkage stress of the epoxy resin (mold resin) packing them is increased.

Thereby, a problem newly arises that on the boundary surface between the circuit substrate and the epoxy resin, separation or resin cracking is generated. Further, another problem also arises that by heat stress due to the use environment conditions, particularly repetitive temperature changing, in the same as with the aforementioned, separation and resin cracking are generated.

The present invention is intended to provide an inexpensive electronic circuit device which is, when packaging not only the electronic circuit substrate but also the base with mold resin, free of separation between the mold resin and the circuit substrate and base and resin cracking due to heat stress.

The present invention is a manufacturing method for an electronic circuit device for, before molding lead terminals composed of a different material from that of the base with mold resin, joining them integrally with the base via frames, and molding, partially excluding the flange and lead terminals installed on the base, the electronic circuit, lead terminals, and flange with mold resin in a batch, and separating and removing the frames from the lead terminals and base after molding with mold resin.

DESCRIPTION OF THE PREFERRED EMBODIMENTS

An embodiment of an assembly of the electronic circuit device of the present invention will be explained hereunder by referring to FIGS. 1 to 29.

Figure 1:
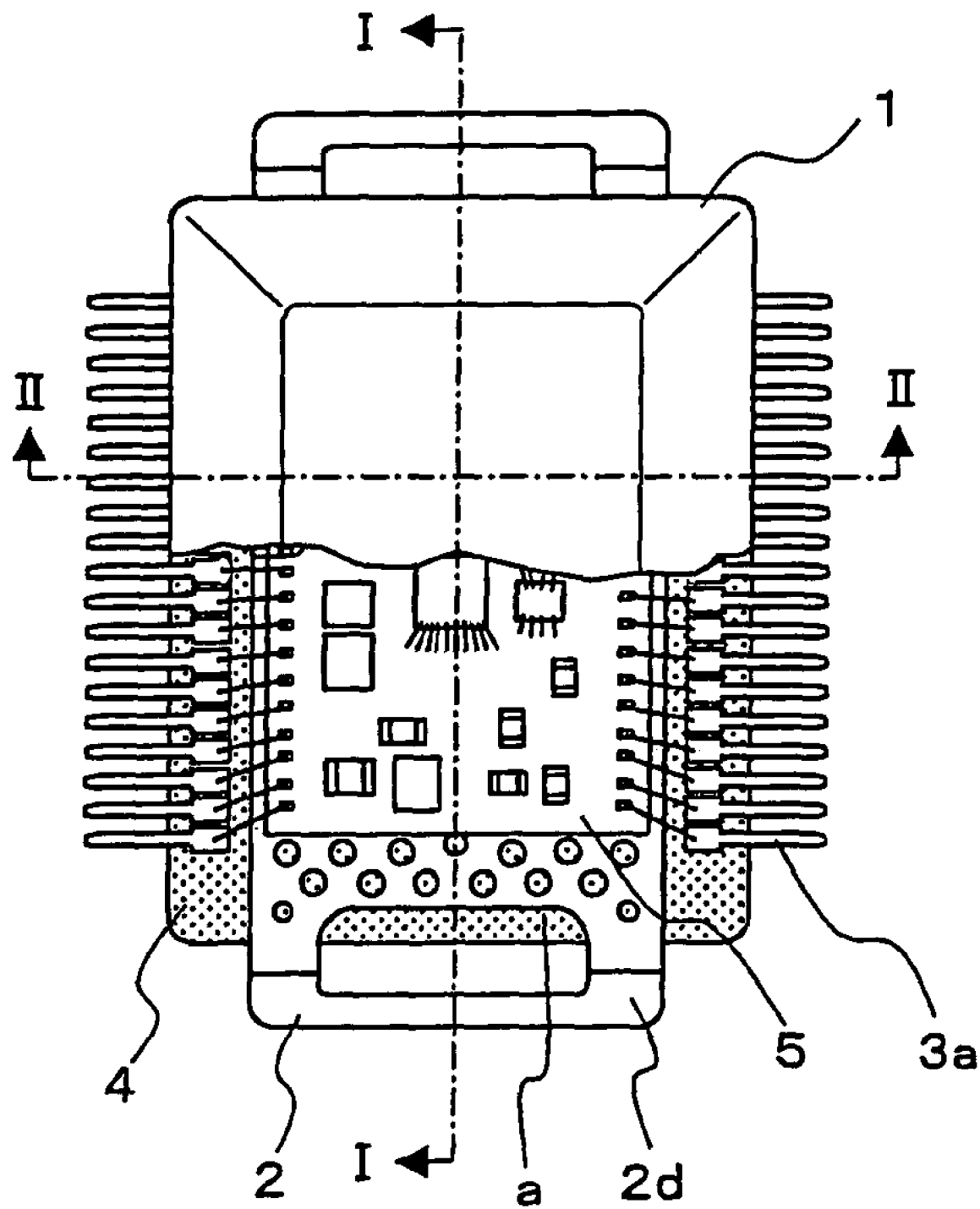
FIG. 1 is a plan view showing of an electronic circuit device for car use showing an embodiment of the present invention which is partially sectioned crossly.
Figure 2:
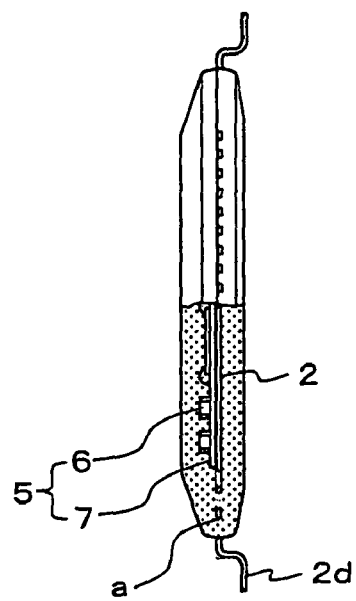
FIG. 2 is a partial longitudinal side view along the line I—I shown in FIG. 1.
Figure 3:
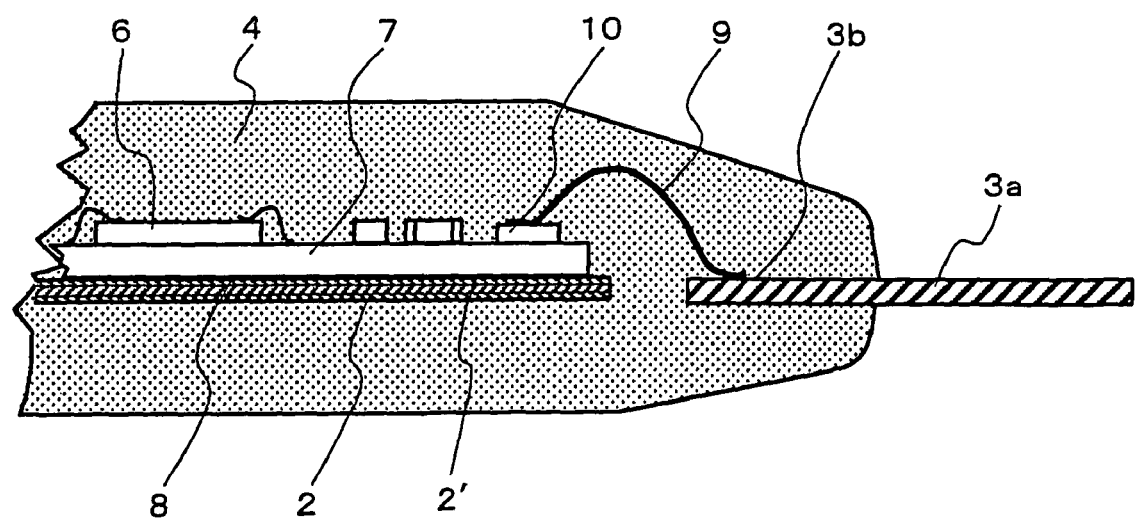
FIG. 3 is a partial transverse side view along the line II—II shown in FIG. 1.

FIG. 1 is a plan view of an electronic circuit device for car use (control unit) 1 and FIGS. 2 and 3 are partial cross sectional views respectively along the lines I—I and II—II shown in FIG. 1.

On a base 2 having a flange 2d, an electronic circuit assembly 5 composed of circuit elements 6 and a circuit substrate 7 is loaded. The loading is carried out by adhering the circuit substrate 7 to the top of the base 2.

Lead terminals 3a arranged in a comb form, when they are to be electrically connected to an external connecting object (not shown in the drawing), are fit into the harness connector of the external object or connected to the harness terminals thereof by welding.

The electronic circuit assembly 5 and the lead terminals 3a are electrically connected to each other via thin aluminum wires 9 by the wire bonding method such as thermal contact bonding or ultrasonic waves.

The electronic circuit assembly 5 is adhered to the top of the base 2, and the electronic circuit assembly 5 and the lead terminals 3a are connected by the thin aluminum wires 9, and then these parts such the circuit elements 6, the circuit substrate 7, the base 2, and the lead terminals 3a are embedded into mold resin (hereinafter referred to as sealing resin) 4 in a batch except a part of the lead terminals 3a and a part of the flange 2d.

The sealing resin 4 is manufactured by transfer molding. The transfer molding is generally a method using thermo setting resin such as epoxy resin as sealing resin and tablet-shaped epoxy resin formed by compression-molded powder is fused by applying predetermined pressure at a predetermined temperature and is fluidized and cured in a mold. The method is widely adopted as a package of a chip such as an LSI (large scale integrated circuit).

The sealing resin 4 has a low linear expansion coefficient and overall packs the internal parts. The sealing resin 4 is given an optimal physical property in order to always keep the adhesive force with the internal parts at a predetermined value and to prevent the soldered parts and the thin wire bonding connections between the semiconductor chips and the circuit substrate from separation and disconnection due to heat stress.

For an electronic circuit device for car use, entry of water and oil from the respective adhesive boundary surfaces between the sealing resin 4 and the lead terminals 3a and base 2 due to separation caused by repetitive heat stress during operation is worried about. The respect can be solved by making the difference in linear expansion coefficient between the lead terminals 3a and base 2 and the sealing resin 4 smaller inasmuch as is possible and reducing the heat stress between the members.

For the lead terminals 3a, a heat conductive copper or copper series alloy material is selected. For the circuit substrate 7, a material having a comparatively small linear expansion coefficient such as ceramics or glass-ceramics is selected so as to form a predetermined circuit pattern. For the base 2 to which the circuit substrate 7 is adhered, a material whose linear expansion coefficient is close to those of the circuit substrate 7 and the sealing resin 4 is selected. Therefore, the linear expansion coefficient of the lead terminals 3a is larger than that of the base 2.

A material that copper is laminated on both sides of an alloy of 64% iron—36% nickel which is referred to as Invar, the so-called cladding material is selected for the base 2, and the thickness ratio between both metals is changed, thus a desired composite linear expansion coefficient can be obtained. Meanwhile, with respect to a single material, the linear expansion coefficient of Invar is about 1 ppm/° C. and that of copper is 16.5 ppm/° C.

Therefore, to make the linear expansion coefficient of the cladding material smaller, the copper part is made thinner and the Invar part is made thicker. Therefore, in this embodiment, for example, when the linear expansion coefficient of the circuit substrate 7 is 6 ppm/° C. and the linear expansion coefficient of the sealing resin 4 (below the glass transition point Tg) is 9 ppm/° C., the linear expansion coefficient of the cladding material is set to 9.3 ppm/° C. As an example of a cladding material having this linear expansion coefficient, when the base 2 is 0.64 mm in thickness, the thicknesses of copper and Invar are respectively 0.156 mm and 0.328 mm.

When the linear expansion coefficient of the cladding material which is close to the linear expansion coefficients of the circuit substrate 7 and the sealing resin 4 is set to 9.3 ppm/° C., the mutual difference in linear expansion coefficient becomes smaller, and the heat stress due to the use environment conditions, particularly repetitive temperature changing is reduced, and the resistance for cracking of the sealing resin 4 and separation of the adhesive boundary surfaces with the members is increased.

The cladding material is composed of soft copper and hard Invar which are laminated, so that a problem arises that the difference in hardness between the materials is large and the press-cutting quality is bad. Generally, in press-cutting, the press-cut face is formed in a predetermined shape composed of a dull edge, a shear plane, and a break plane. However, press-cutting the cladding material is equivalent to simultaneously press-cutting thin plates, which are large in hardness difference and different in thickness, in layers, and the dull edges, shear plane, and break plane become obscure, and the inter-plate joint is apt to separate on the press-cutting end face.

For example, the hardness of Invar is 200 Hv (Vickers hardness) and the hardness of copper is about 100 Hv. However, the lead terminals 3a are in a shape that many narrow parts are arranged, so that highly precise press-cutting is difficult.

As a countermeasure to it, in this embodiment, for the base 2 in a simple shape requiring no high precision, a cladding material is used, and for the lead terminals 3a requiring high precision, a copper or copper alloy material is used, and the two are plastically combined.

It is a general structure to press-cut the base 2 and the lead terminals 3a with the same copper alloy material without separated. However, the linear expansion coefficient thereof is 17 ppm/° C. or so and larger than those of the circuit substrate 7 and the sealing resin 4 and in this structure, due to repetitive heat stress when in use, resin cracking and separation of the adhesive boundary surface with resin are easily generated.

Particularly, the base 2 has a wide area and the heat stress acting on the adhesive boundary surface with the sealing resin 4 is large. On the other hand, the lead terminals 3a have a small area and one side thereof is exposed, so that the heat stress is on an unquestionable level.

FIG. 3 is an enlarged cross sectional view of the essential section of the electronic circuit device of this embodiment.

On the top of the base 2, the circuit substrate 7 is adhered with an adhesive 8. In a structure of adhering the overall, it is difficult to closely adhere the boundary surface between the adhesive 8 and the member and an air layer may be formed on the boundary surface during curing of the adhesive 8 or many minute air bubbles may remain in the adhesive.

Therefore, a problem is apt to arise that air bubbles are expanded and crushed due to heat in the transfer mold process and the boundary surface is separated in the neighborhood of the adhesive boundary surface between the adhering part and the sealing resin 4. An example of the adhering method for solving this problem will be described later.

On the circuit substrate 7, a wiring pattern not shown in the drawing is formed and the circuit elements 6 and the bonding pads 10 are joined with solder or a silver paste material (a silver-contained epoxy adhesive). Between the bonding pads 10 and the lead terminals 3a, the thin aluminum wires 9 are electrically connected by the wire bonding method such as heat contact bonding or ultrasonic waves.

The material of the circuit substrate 7 is preferably a material having a linear expansion coefficient close to that of the silicone chips occupying the majority of the circuit elements 6 and a small difference in linear expansion coefficient from that of the sealing resin 4. When the circuit scale is increased, a multi-layer circuit substrate is preferable for miniaturization and a ceramic or glass-ceramic substrate is suitable. When giving priority to heat dissipation, a ceramic substrate having large thermal conductivity is preferable.

Figure 4:
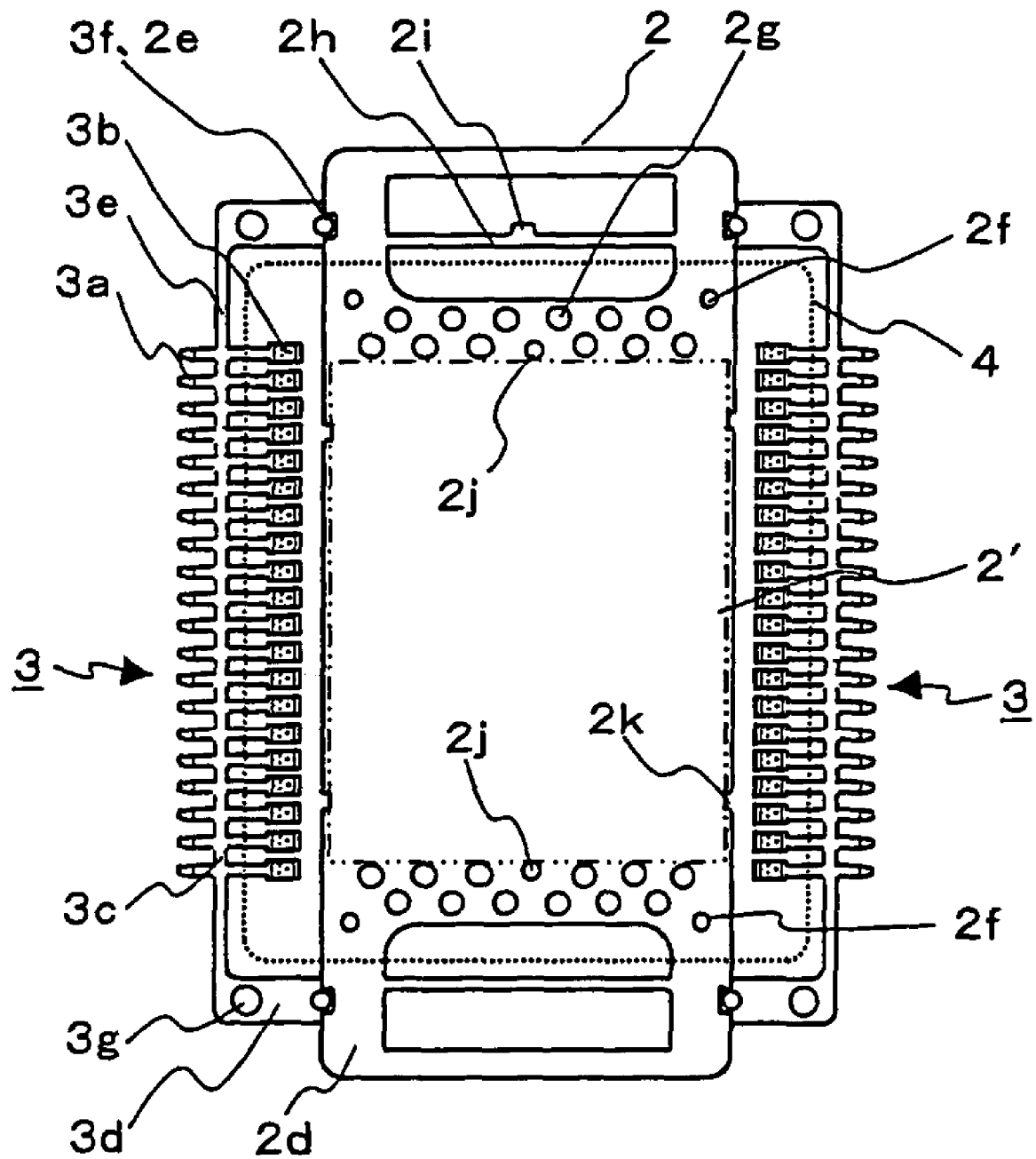
FIG. 4 is a plan view showing the integral shape of the lead frame and base.

FIG. 4 is a drawing showing the base 2 and the lead frame 3 which are joined and integrated. The base 2 has a shape composed of a substrate adhering part 2' adhered to the circuit substrate 7, flanges 2d, joints 2e, positioning holes 2f, many small holes 2g, stoppers 2h, a projection 2i, substrate positioning holes 2j, and slits 2k.

The lead frame 3 is composed of lead terminals 3a, bonding pads 3b, inter-terminal connections 3c, frames 3d, connections 3e, joints 3f, and feed holes 3g, which are all manufactured by press-cutting. And, the parts are plastically combined with the joints 2e and 3f and integrated with the base 2. The combining method will be described later.

The bonding pads 3b for connecting the thin aluminum wires 9 by wire bonding are partially plated with nickel or silver to prevent the surface thereof from oxidation. The flanges 2d are installed to fix to the opposite members and the positioning holes 2f are installed to position the jigs at the time of assembly.

The projection 2i decides the directivity, is asymmetrical about the center, controls the front and rear and the top and bottom of the base 2 in the fixed directions, and reduces fitting errors to the transfer mold caused by manufacturing errors.

Further, the projection 2i also accomplishes an object of preventing an assembly in a state that the circuit substrate 7 is adhered and the wire bonding operation for the electronic circuit assembly 5 is finished via the predetermined process from inserting in the opposite direction when it is to be set in this mold. For the projection 2i, when the joint of the lead frame 3 and the base 2 is in a symmetrical shape, a shape and a position may be optionally selected so as to discriminate the front and rear and the top and bottom of the base 2.

Further, the reason that the inter-terminal connections 3c, the frames 3d, the flanges 2d, and the stoppers 2h constitute a closed loop is that when the part is clamped from top and bottom by the transfer mold, thereby is transfer-molded with the sealing resin 4 and epoxy resin is fused in the mold to a liquid, it is prevented from leaking outside the closed loop.

Between the narrow part of the lead terminal 3a to be fit and the mold, a slight fitting gap is formed, so that liquid epoxy resin leaks outside through this part. However, since the closed loop is structured, it is cured in the loop and then remains as burrs.

And, after transfer molding, the burrs are removed, and the inter-terminal connections 3c, the frames 3d, the connections 3e, the joints 3f and 2e, and the stoppers 2h of the lead frame 3 are cut off, and a plurality of independent lead terminals 3a are formed, and the flanges 2d of the base 2 are punched and folded in a predetermined shape, thus the control unit 1 is completed.

Figure 5:
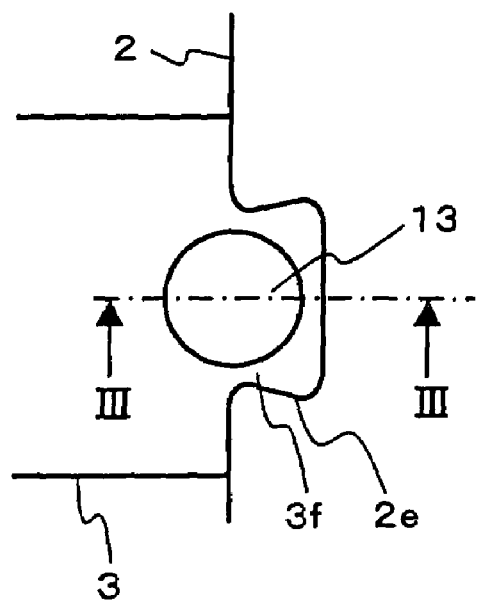
FIG. 5 is a detailed diagram showing the joint shown in FIG. 4.
Figure 6:
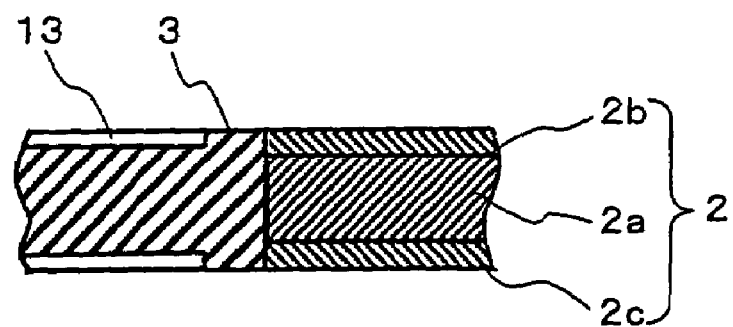
FIG. 6 is a cross sectional view along the line III—III shown in FIG. 5.

FIG. 5 is a detailed diagram of the joined portion of the base 2 and the lead frame 3 and FIG. 6 is a cross sectional view of the joined portion along the line III—III shown in FIG. 5.

Figure 7:
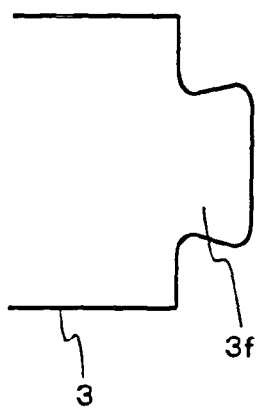
FIG. 7 is a drawing showing another joint shape of the lead frame.
Figure 8:
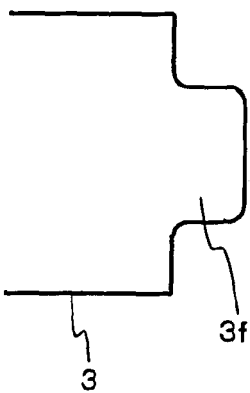
FIG. 8 is a drawing showing still another joint shape of the lead frame.

The joints 2e provided on the base 2 are concave and are fit to the convex joints 3f of the lead frame 3. The shape of a part of the convex joints 3f which is inclined so as to stop in the plane direction is shown in FIG. 7 and the shape of the part which is not inclined is shown in FIG. 8. And, by application of the press load, the joints 3f are crushed from the front and rear in the thickness direction, and concavities 13 are formed, and the joints 2d and 3f are joined by plastic flow of the material. Even if the concave and convex shapes of the joints are reversed, the same joint effect can be obtained.

In the shape shown in FIG. 7, even when the concavity 13 is not formed, the convex joint 3f can stop in the plane direction. However, during the joint operation, the convex joint 3f can be inserted in the concave joint 2e only in the plate-thickness direction. In FIG. 8, there is an advantage that the convex joint 3f can be inserted in either of the plate-thickness direction and the plane direction.

This is, in a case of automatic insertion, advantageous from the viewpoint of an increase in the degree of freedom of design of an automation. When the concavity 13 is formed, the convex joint 3f is spread along the inclined part of the concave joint 2e by plastic flow and stopping force in the plane direction after joining is obtained. However, the press load when the concavity 13 is formed must be made larger than that shown in FIG. 7.

The Invar 2a is harder than the lead frame 3, so that even if the convex joints 3f formed on the lead frame 3 are crushed, there is no problem. However, particularly when the material of the lead frame 3 is a copper alloy comparatively soft, and the Invar part 2a is thin, and the copper parts 2b and 2c are thick, if the concave joints 2e are formed on the base 2, a problem arises that the joints are opened outside. Therefore, according to the thickness ratio between the copper and Invar cladding materials and the material hardness of the lead frame 3, the concavities 13 are formed in either of the lead frame 3 and the base 2.

In this embodiment, in consideration of it, for the lead frame 3, a material lower in hardness than the Invar part 2a of the cladding material is selected. As an example, the material is a copper alloy of 120 Hv.

The cladding material of the base 2 is composed of Invar 2a and copper 2b and 2c and as is generally known, they are applied with predetermined pressure at a predetermined temperature, laminated, and strongly joined by diffusion between the metallic materials. The convex joints 3f of the lead frame 3 are crushed, and the concavities 13 are formed up and down, thus the material is plastically flowed, and the fitting gaps in the plane direction are filled up, and the base 2 and the lead frame 3 are joined integrally with each other.

Figure 9:
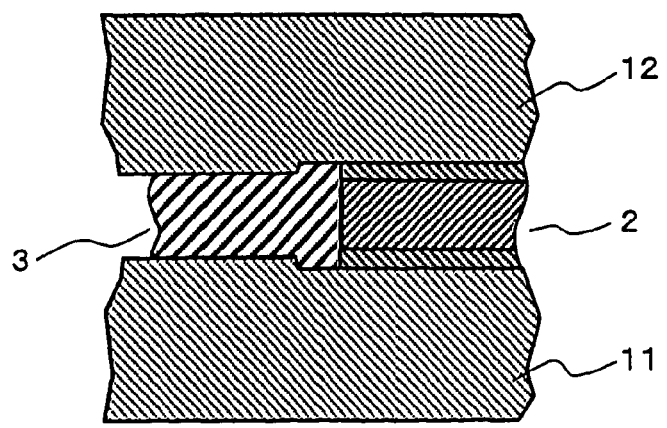
FIG. 9 is a cross sectional view showing a method for forming a concavity for joining.

An example of a method for forming the concavity 13 is shown in FIG. 9.

A lower die 11 and an upper die 12 are in a stepped shape. When a load is applied in the vertical direction, the convex joint 3f of the lead frame 3 is crushed and the concavity 13 is formed. The press condition under which the stepped parts of the dies 11 and 12 make contact with the top and bottom of the lead frame 3 and the top and bottom of the base 2 when a predetermined load is applied is set. When the stepped parts do not make contact with them, the copper parts 2b and 2c locally swell in the thickness direction in the neighborhood of the fit part and may be warped in the thickness direction.

A die structure that the upper and lower dies 11 and 12 hold the base 2 and the lead frame 3 in the vertical direction, and the punch is slid in the vertical direction, thus the concavities 13 are formed may be adopted. Further, the concavities 13 aforementioned are circular. However, they may be formed in any shape including a multilateral shape or a trapezoidal shape along the inclined part.

In the drawing, the materials are the same in thickness. However, the base 2 or the lead frame 3 may be thicker than the other. When heat dissipation must be increased, it is effective to make the base 2 thicker. Further, when the lead terminals 3a are to be connected to the connectors, they can be fit to the proper thicknesses of the opposite female terminals.

Figure 10:
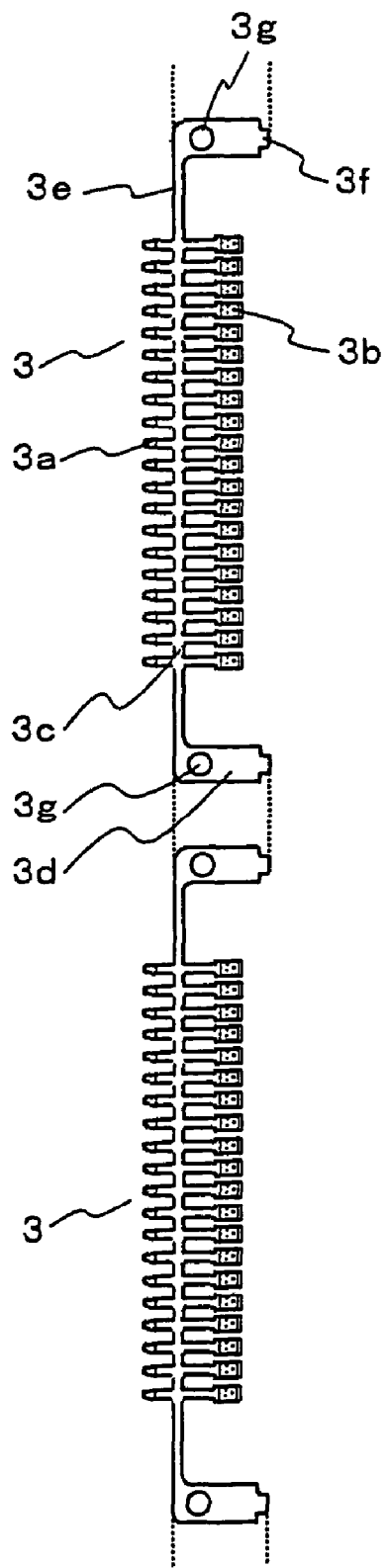
FIG. 10 is a plan view showing the shape of the lead frame.
Figure 11:
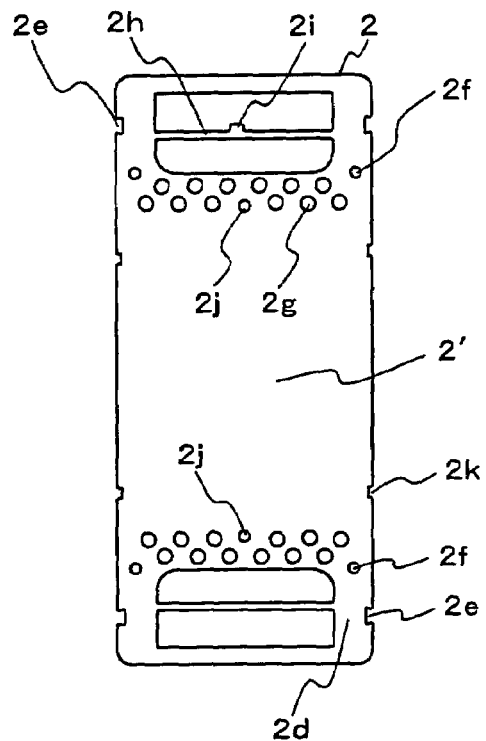
FIG. 11 is a plan view showing the shape of the base.

FIG. 10 shows the shape of the lead frame 3, and FIG. 11 shows the shape of the base 2, and the lead frame 3 and the base 2 are manufactured by press-cutting. The lead frame 3 has the lead terminals 3a, the bonding pads 3b, the inter-terminal connections 3c, the frames 3d, the connections 3e, the joints 3f, and the feed holes 3g.

The parts connected by dotted lines are empty parts for continuous press-cutting. The bonding pads 3b require nickel plating or silver plating for oxidation prevention. However, the bonding pads 3b in a material state before press-cutting may be partially plated in a belt shape or the bonding pads may be partially plated after press-cutting.

The base 2 has the substrate adhering part 2', the flanges 2d, the joints 2e, the positioning holes 2f, many small holes 2g, the stoppers 2h, the projection 2i, the substrate positioning holes 2j, and the slits 2k. In the same way as with the lead frame 3, the base 2 may be shaped so as to provide empty parts for continuous press-cutting.

As mentioned above, the base and the lead terminals are manufactured by different kinds of materials and then the two are integrated by plastic combination, so that depending on the physical properties of the circuit substrate and sealing resin, the required level for heat dissipation, and the opposite connector terminals, the materials of the base and lead terminals can be selected according to an optimal linear expansion coefficient, thermal conductivity, and thickness. Therefore, this is a great effect which cannot be realized by the conventional apparatus that the base and lead frame are composed of the same copper alloy material.

A structure of, in addition to plastic combination, welding or clamping by overlaying and riveting the base and lead terminals in the thickness direction may be considered. However, a problem arises that in the former, deformation is caused due to heat during welding and in the latter, the thickness is increased.

Figure 12:
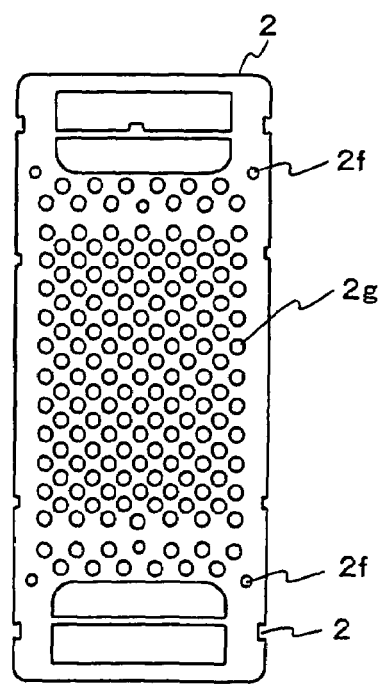
FIG. 12 is a plan view showing another shape of the base.

FIG. 12 shows another shape of the base 2, in which many small holes 2g are formed in a slightly narrower range than the area of the circuit substrate 7 and outside the structure of the circuit substrate 7.

Figure 13:
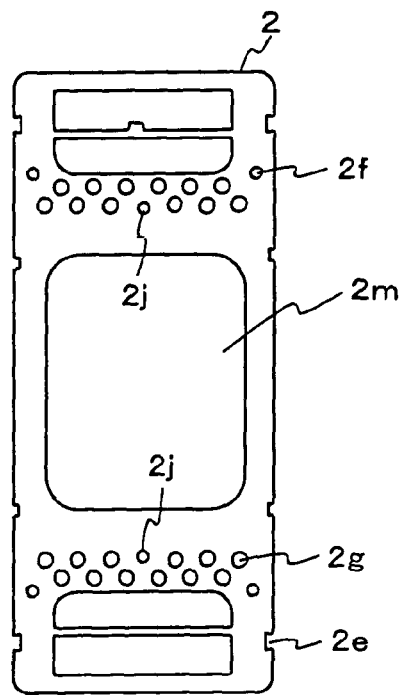
FIG. 13 is a plan view showing still another shape of the base.

FIG. 13 shows still another shape of the base 2, in which a large window 2m is provided in a slightly narrower range than the area of the circuit substrate 7 and many small holes 2g are formed outside the structure of the circuit substrate 7.

Figure 14:
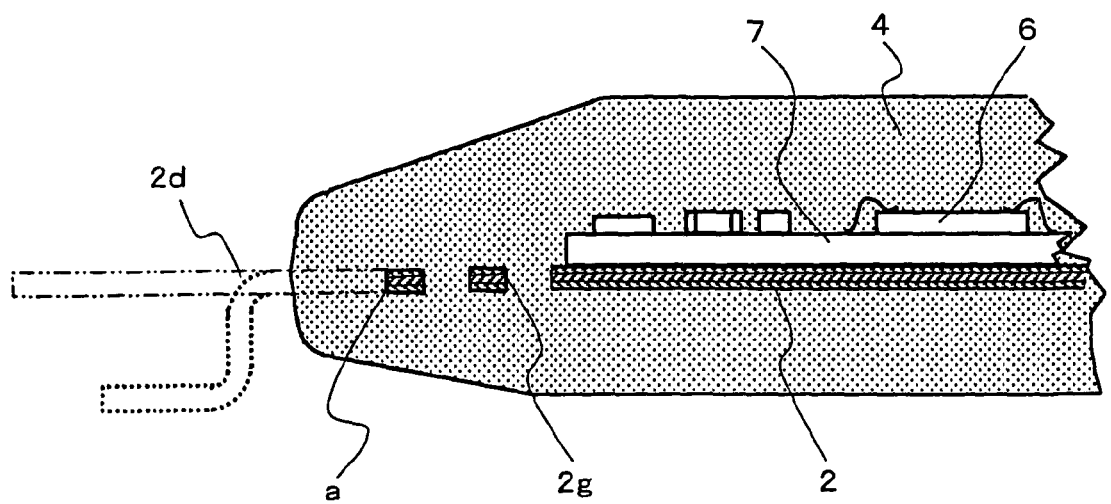
FIG. 14 is a cross sectional view of the essential section showing the state of the small holes filled with sealing resin.
Figure 15:
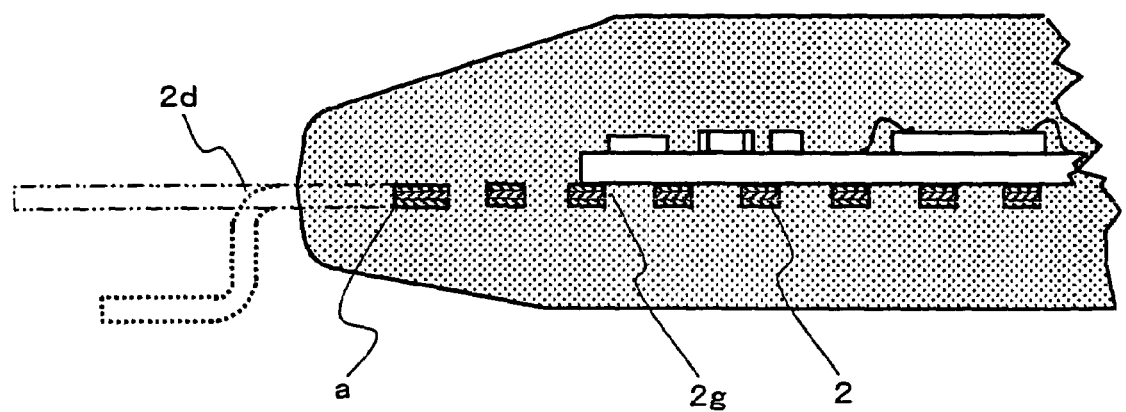
FIG. 15 is a cross sectional view of another essential section showing the state of the small holes filled with sealing resin.

FIG. 14 is an enlarged vertical cross sectional view of FIG. 1 equivalent to FIG. 2, in which the shape of the base 2 is the same as that shown in FIG. 11 and the small holes 2g are filled with the sealing resin 4. FIG. 15 is also an enlarged cross sectional view of the shape shown in FIG. 12 and FIG. 16 is also an enlarged cross sectional view of the shape shown in FIG. 13.

In FIG. 14, the small holes 2g are formed only outside the structure of the circuit substrate 7 and in FIG. 15, the small holes 2g are formed inside and outside the structure of the circuit substrate 7.

Figure 16:
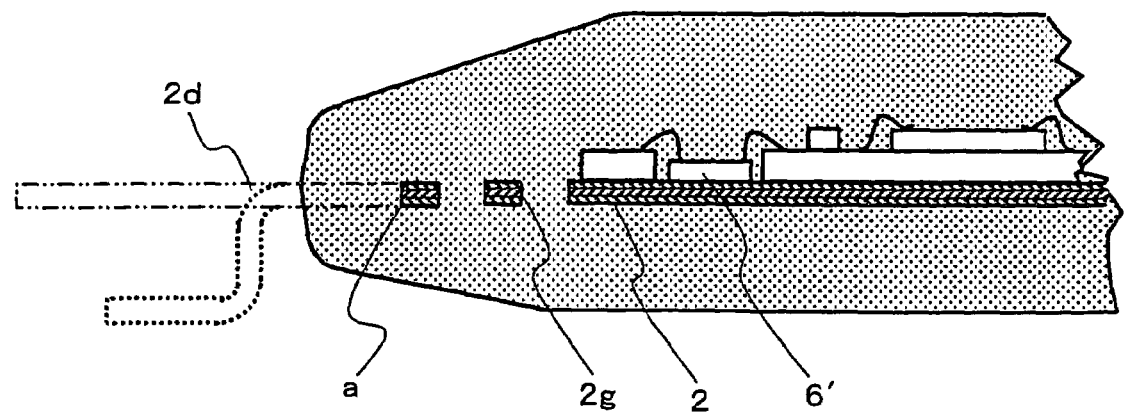
FIG. 16 is a cross sectional view of the essential section showing the shape of the high heating element joined to the base.
Figure 17:
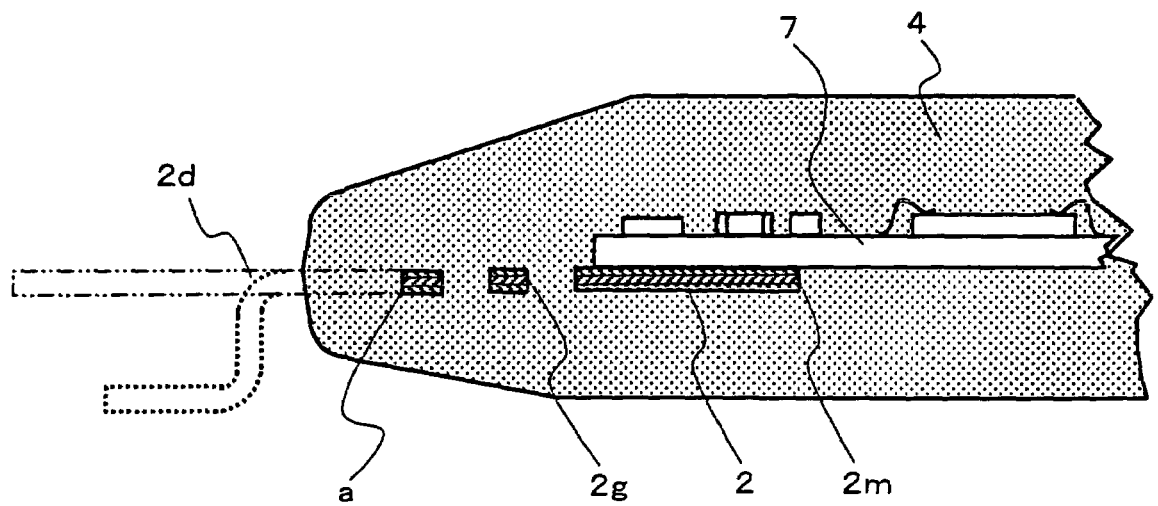
FIG. 17 is a cross sectional view of the essential section showing the state of the window filled with sealing resin.

FIG. 16 shows a structure that a high heating element 6' is joined to the base 2 with solder or a silver paste material and a window is provided in the circuit substrate 7 so as to avoid the location.

The cladding material, as described above, is composed of copper and iron-nickel alloy, so that there is a disadvantage that the thermal conductivity thereof is smaller than that of copper itself or copper alloy. The thermal conductivity of copper itself is 396 W/(m·k), while when the linear expansion coefficient of the cladding material of this embodiment is 9.3 ppm/° C., the thermal conductivity is 225 W/(m·k) in the plane direction and 25 W/(m·k) in the thickness direction.

When the high heating element 6' is loaded on the circuit substrate 7, a temperature lower than a predetermined increased temperature may not be ensured. To solve it, the structure as shown in FIG. 16 is effective. The heat of the high heating element 6' is directly transferred to the base 2 and dissipated to the opposite member via the flange 2d.

Whether or not to load the high heating element 6' on the circuit substrate 7 is selected depending on the heating density (amount of heat/element volume) of the element. Further, it is possible, without the window being provided, to make the circuit substrate 7 smaller and join the high heating element 6' to the base 2.

When the respective adhesive boundary surfaces between the sealing resin 4 and the circuit substrate 7, between the sealing resin 4 and the lead terminals 3a, and between the sealing resin 4 and the base 2 are separated due to temperature changes when in use and repetitive heat stress caused by the difference in linear expansion coefficient between the members, entry of water and oil through the parts is worried about.

Epoxy resin, as is generally known, has adhesive strength with a member. However, when the difference in linear expansion coefficient from the member is not suitable, the aforementioned separation is apt to generate due to repetitive heat stress. The operation effects of the small holes 2g will be described hereunder.

Separation is apt to generate from the shape-suddenly changed part outside the circuit substrate 7 or outside the base 2. Namely, the separation develops starting from the four corners of the circuit substrate 7 and the part a of the base 2 shown in FIGS. 1, 2, and 14 to 16.

In the structure of this embodiment, many small holes 2g are formed in the base 2 and the holes are filled with the sealing resin 4. Due to existence of the small holes 2g, the rigidity of the base 2 is reduced, and when local separation tends to generate, the resin of the neighboring small holes acts as a breakwater, and an effect of suppression of generation and development of separation is produced.

In FIG. 11, 24 small holes 2g are formed outside the circuit substrate 7 and the separation stress in the neighborhood thereof is reduced. In FIG. 12, 161 small holes 2g are formed in the overall area of the circuit substrate 7 and in a region wider than it. Therefore, in this shape, the base 2 including a region equivalent to the area of the circuit substrate 7 is composed of low rigidity.

Low rigidity, since the heat stress due to the difference in linear expansion coefficient from the sealing resin 4 is easily absorbed and many small holes 2g are scattered, provides an advantage of a very large separation prevention effect on the adhesive boundary surface with a member. The size, shape, and number of the small holes 2g may be optionally set. For example, optimum values can be selected in consideration of the following respects.

(1) An aperture smaller than the plate thickness is not suitable for press-cutting.

(2) Increasing the number of holes causes an increase in the cost of the press dies.

(3) When the overall area of holes is made wider, the heat dissipation is reduced, and the rigidity of the base is lowered, and the base is apt to deform due to handling during the adhering operation, and the flatness accuracy gets bad.

(4) The hole shape is preferably circular instead of multilateral in consideration of productivity and maintenance of dies.

In the shape of the base 2 shown in FIG. 13, the large window 2m is provided, so that the central part of the base 2 is of very low rigidity and an effect of reduction of heat stress is obtained. However, since the area of the base 2 is reduced, the thermal conductivity is lowered and heat dissipation is degraded, so that the shape is adopted when a temperature lower than the specified increased temperature is obtained.

When the area of the window 2m is wider inasmuch as is possible, the heat stress reduction effect is great. However, in view of degradation of heat dissipation and adhered area, an area in a certain range is preferably selected. In this shape, when an area of 40% or 80% of the area of the circuit substrate 7 is selected, no boundary surface separation is generated between the sealing resin 4 and the members (the circuit substrate and base) due to heat stress in the heat shock test under the conditions indicated below.

Heat Shock Test Conditions

No. of samples: 5 pieces per each of 40% and 80% of the window area

Temperature: −40° C. to 130° C. (in the air) for one hour

No. of cycles: 1500 cycles

Specification: Shape, FIGS. 1, 2, and 18

Linear expansion coefficient of the circuit substrate 7: 6 ppm/° C.

Linear expansion coefficient of the sealing resin 4: 9 ppm/° C. (less than 120° C. of glass transition point)

Linear expansion coefficient of the base 2: 9.3 ppm/° C.

Linear expansion coefficient of the adhesive 8: 60 ppm/° C. (less than 140° C. of glass transition point)

Elastic modulus of the circuit substrate 7: 270 GPa

Elastic modulus of the sealing resin 4: 3 GPa (less than 120° C. of glass transition point)

Elastic modulus of the base 2: 120 GPa

Elastic modulus of the adhesive 8: 0.3 GPa (less than 140° C. of glass transition point)

Generally, if the boundary surface can satisfy 1000 cycles under the heat shock test conditions, in a use environment when such a kind of electronic circuit device is mounted in an engine, it is equivalent to a running distance of a car of 150000 to 200000 km and the area of the window 2m is suitable.

Figure 18:
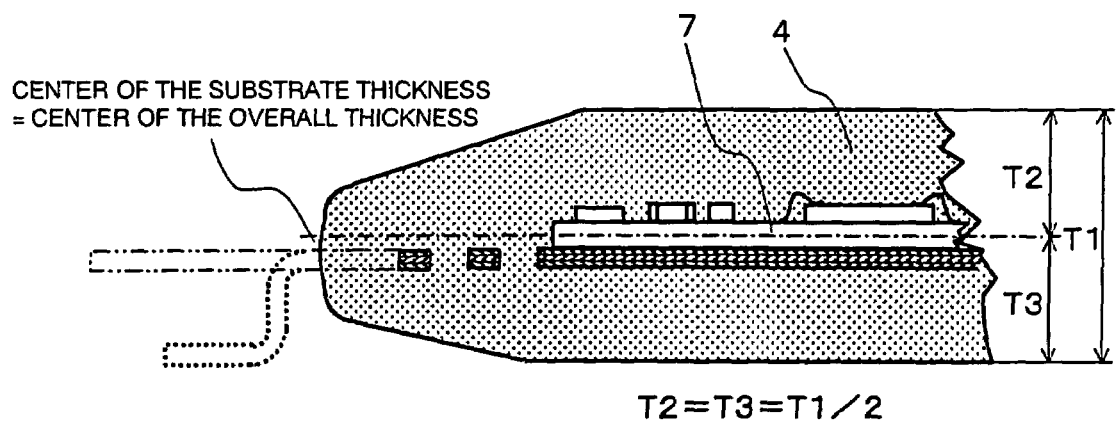
FIG. 18 is an illustration for setting optimal dimensions for minimizing heat stress due to temperature changes.

FIG. 18 is an illustration for setting optical dimensions for minimizing the heat stress due to temperature changes and when the overall thickness T1 of the sealing resin 4 is divided into two parts of T2 and T3 of vertical thickness, the central line of the thickness of the circuit substrate 7 coincides with the halved line. The effect will be explained hereunder.

The heat stress due to temperature changes when in use is generated according to the difference in linear expansion coefficient of each member. In the embodiment that the linear expansion coefficient of the circuit substrate 7 is 6 ppm/° C., and the linear expansion coefficient of the sealing resin 4 is 9 ppm/° C., and the linear expansion coefficient of the base 2 is 9.3 ppm/° C., when the dimensions are set as indicated above, since the linear expansion coefficients of the sealing resin 4 and the base 2 are almost equal to each other, at low temperature, a warp is generated by shrinkage of the sealing resin 4 that the upper surface of the sealing resin 4 becomes concave and the lower surface thereof also becomes concave.

The warp amount is the same between the upper and lower resins, and when the center of the thickness of the circuit substrate 7 is set in the aforementioned position, the circuit substrate 7 itself will not be warped. Namely, the reason is that on the top and bottom of the circuit substrate, only the shrinkage stress of the sealing resin 4 is acted and the warp is mutually canceled.

Figure 19:
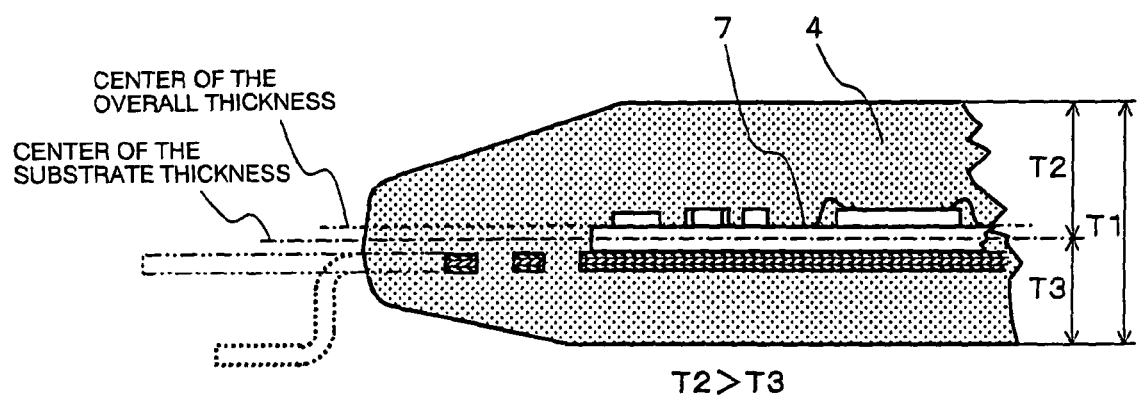
FIG. 19 is an illustration for setting dimensions for increasing heat stress due to temperature changes.

For example, the center of the thickness of the circuit substrate 7 is shifted under the center of the overall thickness of the sealing resin 7, and when the dimensions are set as shown in FIG. 19, T2 is larger than T3, and at low temperature, the whole is warped concave on the upper side and convex on the lower side.

When the sealing resin is divided into two parts in the thickness direction, the top of the circuit substrate 7 is positioned almost at the center of the thickness of the sealing resin 4. Assuming the linear expansion coefficient of the upper side resin as αA and the composite linear expansion coefficient of the circuit substrate 7, the base 2, and the lower side resin as αB, since αA is larger than αB, at low temperature, due to shrinkage of the sealing resin 4, the whole is warped concave on the upper side and convex on the lower side.

The circuit substrate 7 and the base 2 are also warped slightly. At high temperature, the warp disappears, while at low temperature, the same warp is generated again. When changing of temperature, consequently, changing of warp is repeated, between the corners of the top of the circuit substrate 7 and the sealing resin 4, local separation stress is acted and separation is developed starting from the parts.

In the dimension setting shown in FIG. 18, even if the temperature is changed, the circuit substrate 7 and the base 2 will not be warped, so that separation stress is hardly generated between the sealing resin 4 and them. The reason is that between the circuit substrate 7 and the sealing resin 7, although shearing force is acted in the plane direction due to the difference in linear expansion coefficient between the two, the circuit substrate 7 and the base 2 are not warped, and the separation force due to the shearing force is small.

In the structure of adhering the overall, it is difficult to closely adhere the boundary surface between the adhesive and the member, thus an air layer may be formed in the boundary surface during curing of the adhesive and many fine air bubbles are apt to remain in the adhesive. Therefore, a problem is apt to arise that air bubbles are expanded and crushed due to heat in the transfer mold process and the boundary surface is separated in the neighborhood of the adhesive boundary surface between the adhered part and the sealing resin 4.

However, in the adhering operation process, if a print mask with a thickness of several tens μm is used, and the adhesive 8 is printed, and then adhesive drops in an x shape or a circular shape are added to the central part of the print surface, when the electronic circuit assembly 5 is loaded, air bubbles in the adhesive are apt to be ejected outward from the central part of the circuit substrate 7 and the aforementioned problem can be reduced.

An adhering jig is used in the adhering operation, and pins of adhering jigs are inserted into the positioning holes 2f, the substrate positioning holes 2j, and the slits 2k formed in the base 2, and the circuit substrate 7 is precisely positioned.

In addition to the aforementioned adhering method, by a method for using, for example, epoxy series sheet-like adhesive with a thickness of several tens μm as an adhesive 8, applying a load on the top of the circuit substrate 7, and applying a predetermined temperature for a predetermined time, the aforementioned problem can be solved.

In this method, firstly, an assembly that the base 2 and the lead frame 3 are joined is loaded on a receiving jig. The sheet-like adhesive is put on the top of the base 2 and the circuit substrate 7 is loaded on it. And, a load is applied to the top of the circuit substrate 7 by a pressing jig. The predetermined temperature is applied for the predetermined time in this state, and the sheet-like adhesive is fused and cured, and the adhering process is finished.

The material of the circuit substrate 7 is ceramics or glass-ceramics, and the Young's modulus of elasticity thereof is high, and the material is hard, so that when a load is applied, the material is easily cracked. For the sheet-like adhesive, in consideration of this respect, an adhesive having low elastic modulus which can be fused and cured at a low load is selected.

Further, to prevent the conductor pattern formed on the circuit substrate 7 from scratching and the protective glass film from cracking, attention must be given such that as an irregularity absorbing material, for example, a polyester resin film is loaded on the circuit substrate 7 or elastic heat-resistant resin is coated on the surface of a pressing jig.

Further, when the warp of the base 2 is large and the load is applied in the aforementioned adhering process, the adhesive is cured in a state that the warp is corrected and when the load is removed, the stress for returning the warp due to correction to the original state acts on the adhered part.

Therefore, a problem arises that the adhesive boundary surface is separated by the stress. Even if the boundary surface is not separated at room temperature after ending of adhesion, particularly in the process of joining the electronic circuit elements 6 with solder, the elements pass through a solder reflow furnace at 2 hundreds several tens° C., so that a reduction in the adhesive strength is added, thus separation is apt to generate.

To prevent it, a polyester resin film is loaded on the adhering jig and positioned so as to touch the bottom of the base 2. Thereby, the correction amount of the warp can be reduced. However, when the warp is too large, the prevention effect is lost, so that to control the warp to a predetermined value or less, the manufacturing accuracy of the base 2 must be controlled.

Next, a selection example of a sheet-like adhesive will be explained.

The thickness of a sheet composed of a main component of epoxy series adhesive is set to 50 to 200 μm and the area thereof is slightly narrower than that of the circuit substrate 7. Generally, this kind of sheet-like adhesive has a structure that both sides thereof are held by a polyester resin film with a thickness of several tens μm. The film on one side is separated, and the side is loaded on the base 2, and the base 2 is pressed by a roller from the top thereof via the film on the other side or pressed by a press so as to execute temporary adhesion.

In this case, under a perfect curing condition such as at 150° C. for 1 hour, the base 2 is pressed in an atmosphere of 50° C. for several seconds and temporarily adhered, and the film on the opposite surface is separated, and the circuit substrate 7 is loaded on it and heated and pressed at 150° C. for 3 minutes as primary adhesion, and then actually cured at 150° C. for 1 minute without pressurization. Further, the operation may be moved to the primary adhering process without executing temporary adhesion.

In the shape example shown in FIG. 11 that a plurality of small holes 2g are formed outside the circuit substrate 7, the adhering method using the print adhesive mentioned above may be used. However, in the shape example shown in FIG. 12 that the small holes 2g are formed in a wide region including the overall area of the circuit substrate 7, it is difficult to adopt this adhering method. The reason is that it is difficult to manufacture a mask capable of printing an adhesive in a shape of the part where many small holes 2g are avoided.

In the shape shown in FIG. 12, an adhering method for using a sheet-like adhesive can be adopted. The reason is that in a sheet-like adhesive, many small holes can be formed by press-cutting. Further, this adhering method can be adopted also in the shape shown in FIG. 11.

FIGS. 20 to 23 are drawings showing the adhering methods and plane shapes of adhesive.

Figure 20:
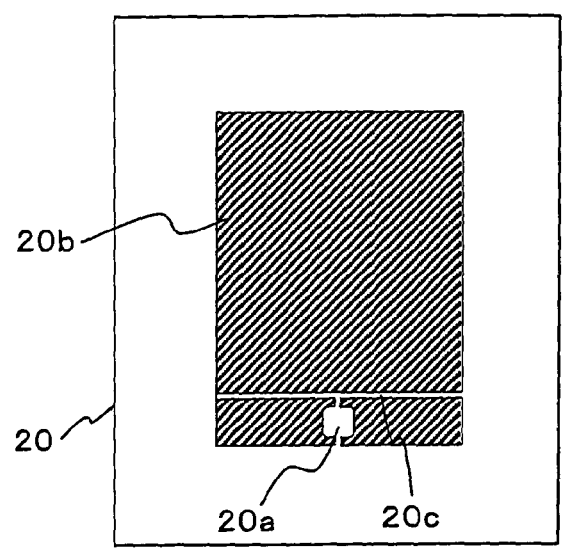
FIG. 20 is a plan view showing the mask shape for printing a liquid adhesive.
Figure 21:
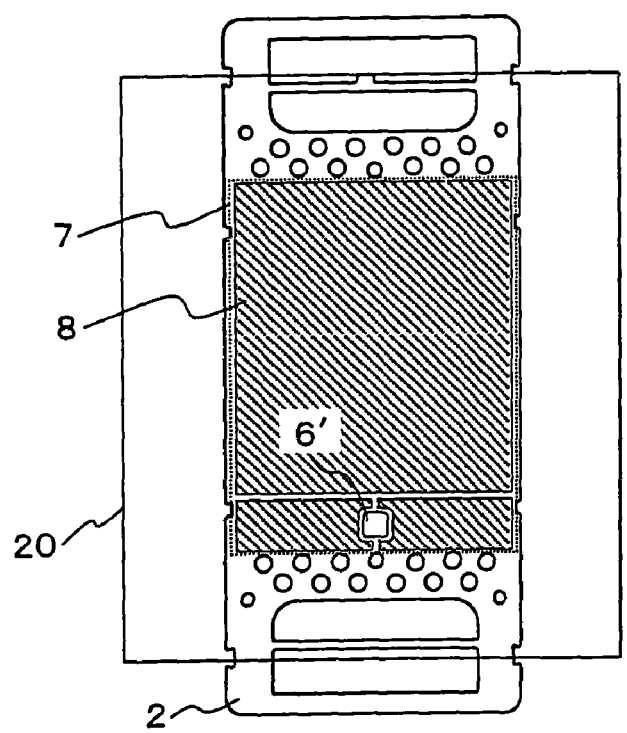
FIG. 21 is a plan view showing the state that an adhesive is printed on the plate.

FIG. 20 is a plan view showing the mask shape for printing a liquid adhesive. This is an example when the high heating element 6' shown in FIG. 16 is joined to the plate 2 and FIG. 21 is a drawing showing the state that the adhesive 8 is printed on the plate 2.

A mask 20 is manufactured by a metallic material such as a stainless steel plate or a copper alloy plate with a thickness of several tens μm and is in a shape having a bridge 20c for connecting an island 20a and the mask 20 and a window 20b (hatched part) for printing the adhesive 8. The island 20a is a part for loading the high heating element 6' and the outside of the adhesive 8 is a region slightly narrower than the structure of the circuit substrate 7.

The bridge 20c is not printed with the adhesive 8. However, the width thereof is about several hundreds μm and the viscosity of the adhesive 8 is low. Therefore, when some time elapses, it flows from both sides, so that there is no problem.

Figure 22:
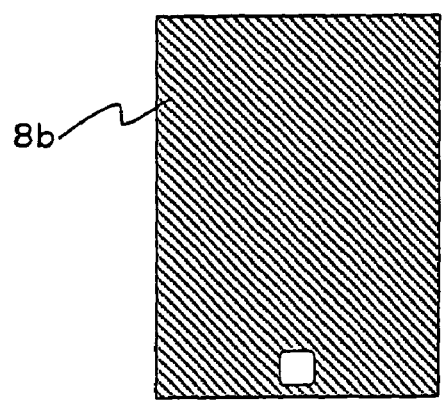
FIG. 22 is a plan view showing the shape of a sheet-like adhesive having no small hole.
Figure 23:
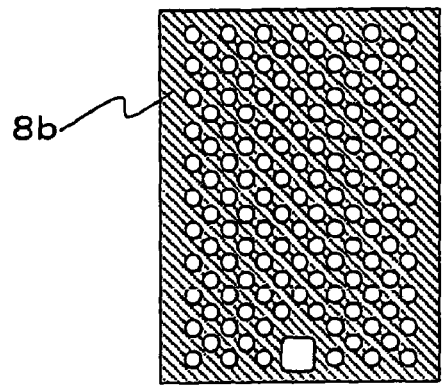
FIG. 23 is a plan view showing the shape of a sheet-like adhesive having small holes.

FIGS. 22 and 23 show the shapes when an adhesive sheet is used for the adhesive 8. When the adhesive 8 is equivalent to that shown in FIG. 21, it is manufactured in the shape shown in FIG. 22 and when many small holes 2g are formed on the lower side of the circuit substrate 7, it is manufactured in the shape shown in FIG. 23.

When the small holes 2g are not to be formed on the lower side of the circuit substrate 7, either of the sheet-like adhesive and liquid adhesive may be used. However, when they are to be formed, it is difficult to print by the mask. Namely, the reason is that in the part equivalent to the small holes 2g, many islands are provided, and a mask shape for connecting them with the bridge is formed, so that the region for printing the adhesive is small and it is difficult to prevent the side walls of the small holes 2g from flowing of the adhesive.

Therefore, in this case, the sheet-like adhesive is suitable. The sheet-like adhesive, as described already, has a structure that both sides thereof are held by a polyester resin film with a thickness of several tens μm, so that many small holes can be easily made by press-cutting.

The adhesive 8 is explained as an epoxy series adhesive. However, it may be a silicone series adhesive. The epoxy sealing resin 4 and silicone series adhesive are said to be bad in adhesion and when vapor generated at the time of adhesion of the circuit substrate 7 remains in the member, a reduction in the adhesive strength between the sealing resin 4 and the member is worried about.

However, when the bath is sufficiently ventilated during adhesive curing and attention is paid to prevent vapor from remaining, the fear can be avoided. The silicone series adhesive has a physical property that the elastic modulus thereof is smaller than that of the epoxy series adhesive and has an advantage that it can absorb the heat stress due to the difference in linear expansion coefficient between the circuit substrate 7 and the base 2.

Figure 24:
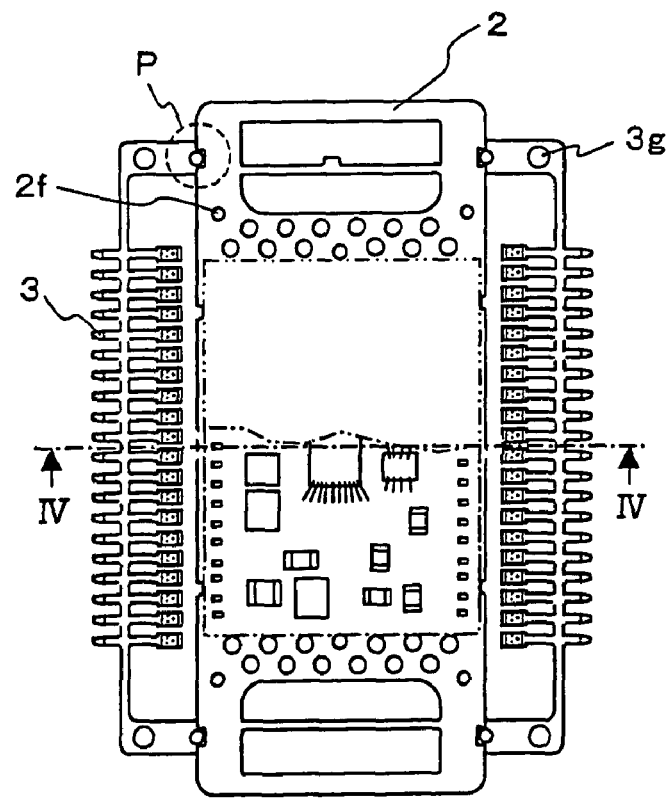
FIG. 24 is a plan view showing the joined state of the base and lead frame.

FIG. 24 shows a completed state that the electronic circuit assembly 5 formed by printing paste solder on a predetermined wiring pattern of the circuit substrate 7, then loading the parts such as the circuit elements 6 and the bonding pads 10, fusing the solder in the reflow furnace, and curing at room temperature so as to provide electrical junction is adhered to the joint of the base 2 and the lead frame 3.

Figure 25:
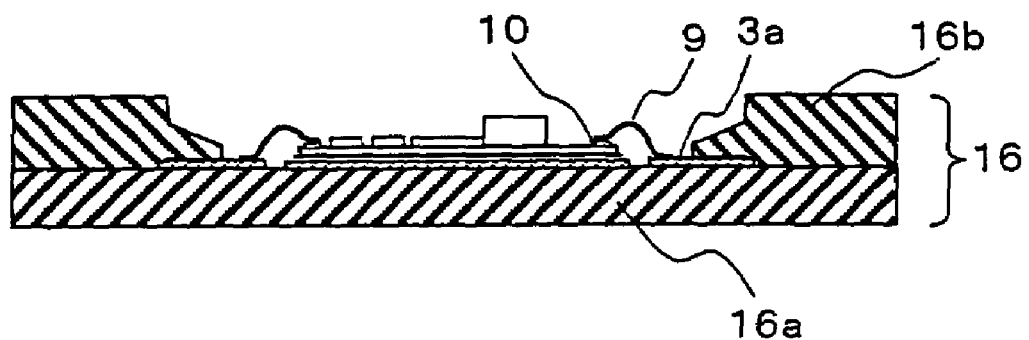
FIG. 25 is a cross sectional view showing the state before the wire bonding operation along the line IV—IV shown in FIG. 24.

FIG. 25 is a cross sectional view showing the jig for the wire bonding operation and the section along the line IV—IV shown in FIG. 24. The assembly in the state that the solder junction process is finished and the electronic circuit assembly 5 is adhered to the joint of the base 2 and the lead frame 3 is loaded on a lower jig 16a of a wire bonding jig 16.

Next, the base 2 and the lead frame 3 are pressed down by an upper jig 16b and using a clamp jig not shown in the drawing, the two are fixed not to move vertically and in the plane direction. The wire bonding operation uses an optional method such as thermal contact bonding or ultrasonic waves and electrically connects between the bonding pads 10 and the lead terminals 3a of the circuit substrate 7 by the thin aluminum wires 9.

Figure 26:
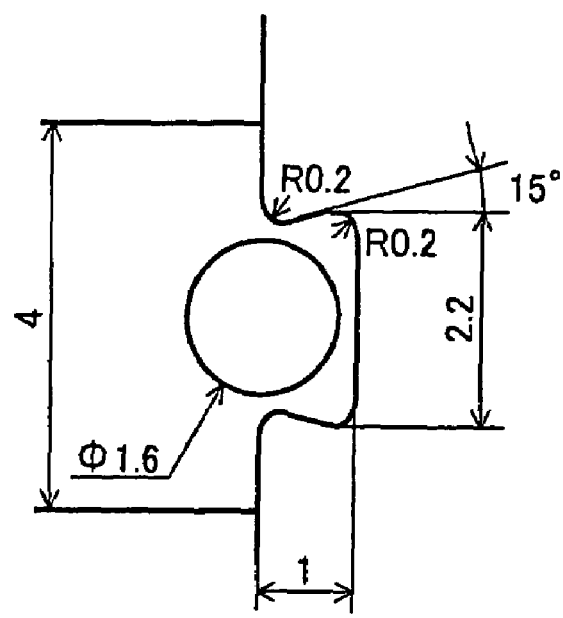
FIG. 26 is a detailed diagram of the part P shown in FIG. 24.
Figure 27:
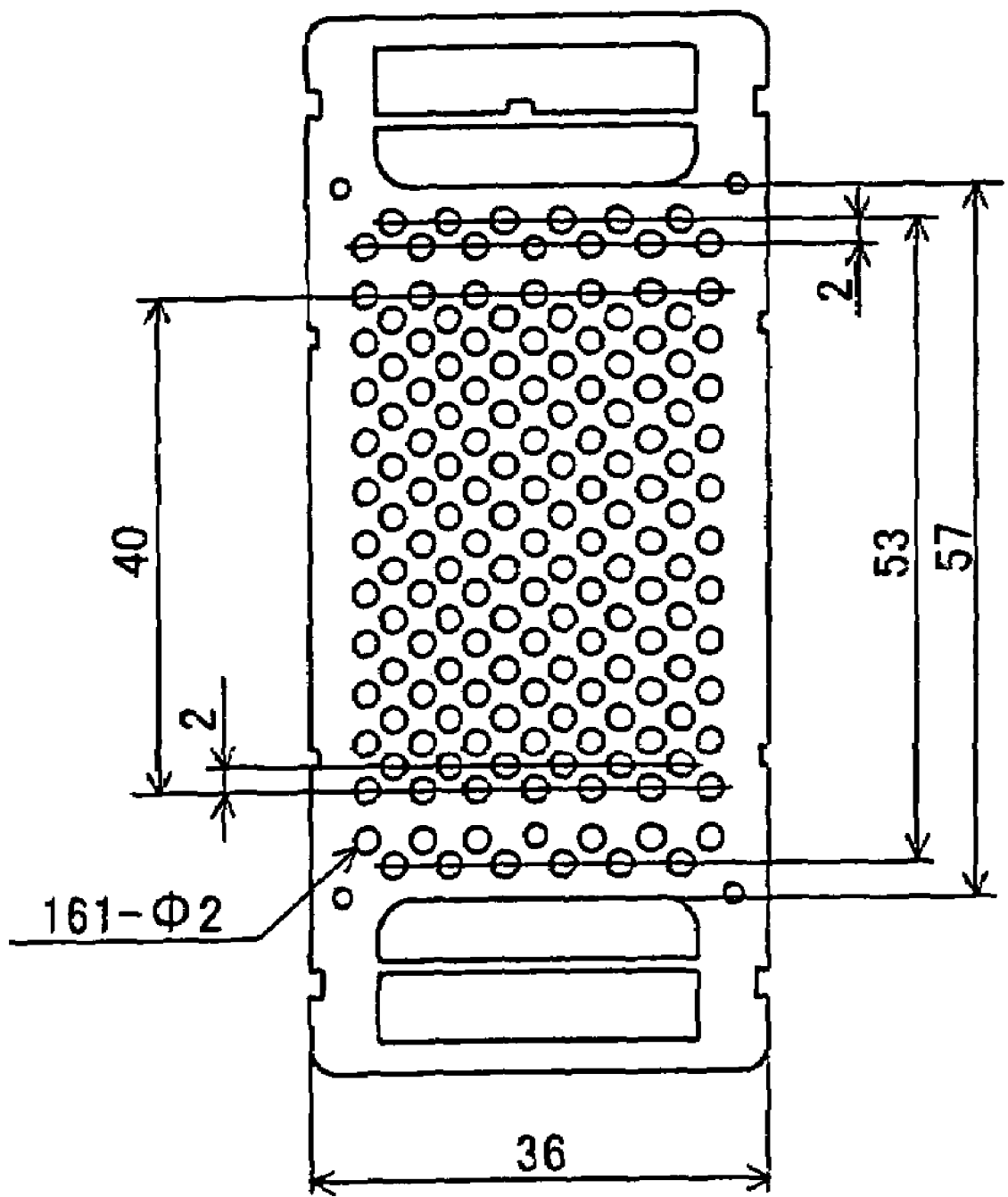
FIG. 27 is a plan view showing the small holes formed in the base and concrete dimensions thereof.
Figure 28:
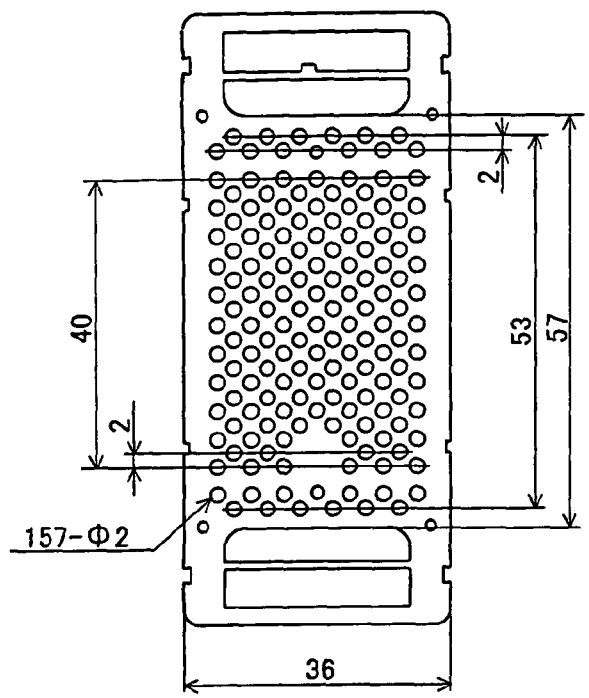
FIG. 28 is a plan view showing the installation state of the small holes when the high heating element is to be joined to the plate and concrete dimensions thereof.
Figure 29:
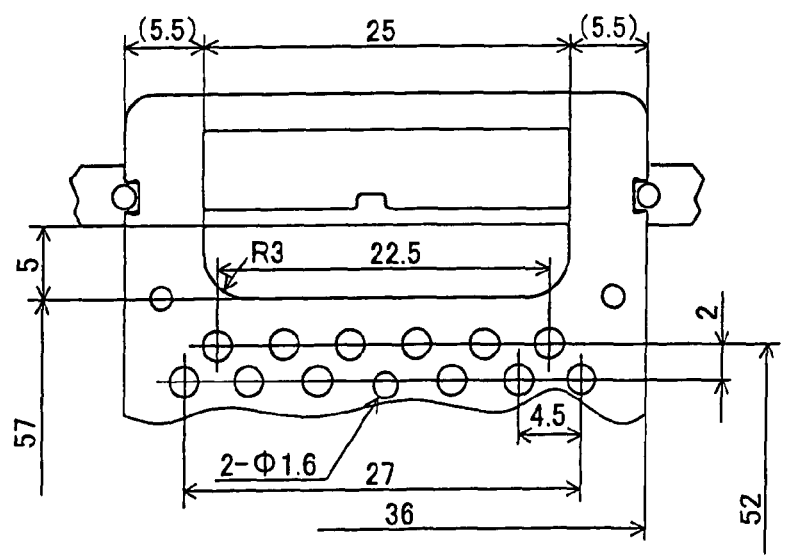
FIG. 29 is a plan view showing concrete dimensions of the small holes shown in FIGS. 27 and 28.

FIG. 26 is a plan view showing the part P (joint) shown in FIG. 24 in detail, and FIG. 27 is a plan view showing the small holes 2g formed in the base 2 shown in FIG. 12 and the concrete dimensions thereof, and FIG. 28 is a plan view showing the installation state of the small holes 2g when the high heating element 6' is to be joined to the base 2 and the concrete dimensions thereof. FIG. 29 is a plan view showing the concrete dimensions of the small holes 2g shown in FIGS. 27 and 28.

Further, as explained in the shape example that many small holes 2g are formed in the base 2, when the use environment temperature range is comparatively narrow and the heat stress is small, the small holes 2g may be eliminated. In this case, a print mask of the adhesive 8 or a sheet-like adhesive can be easily manufactured.

Figure 30:
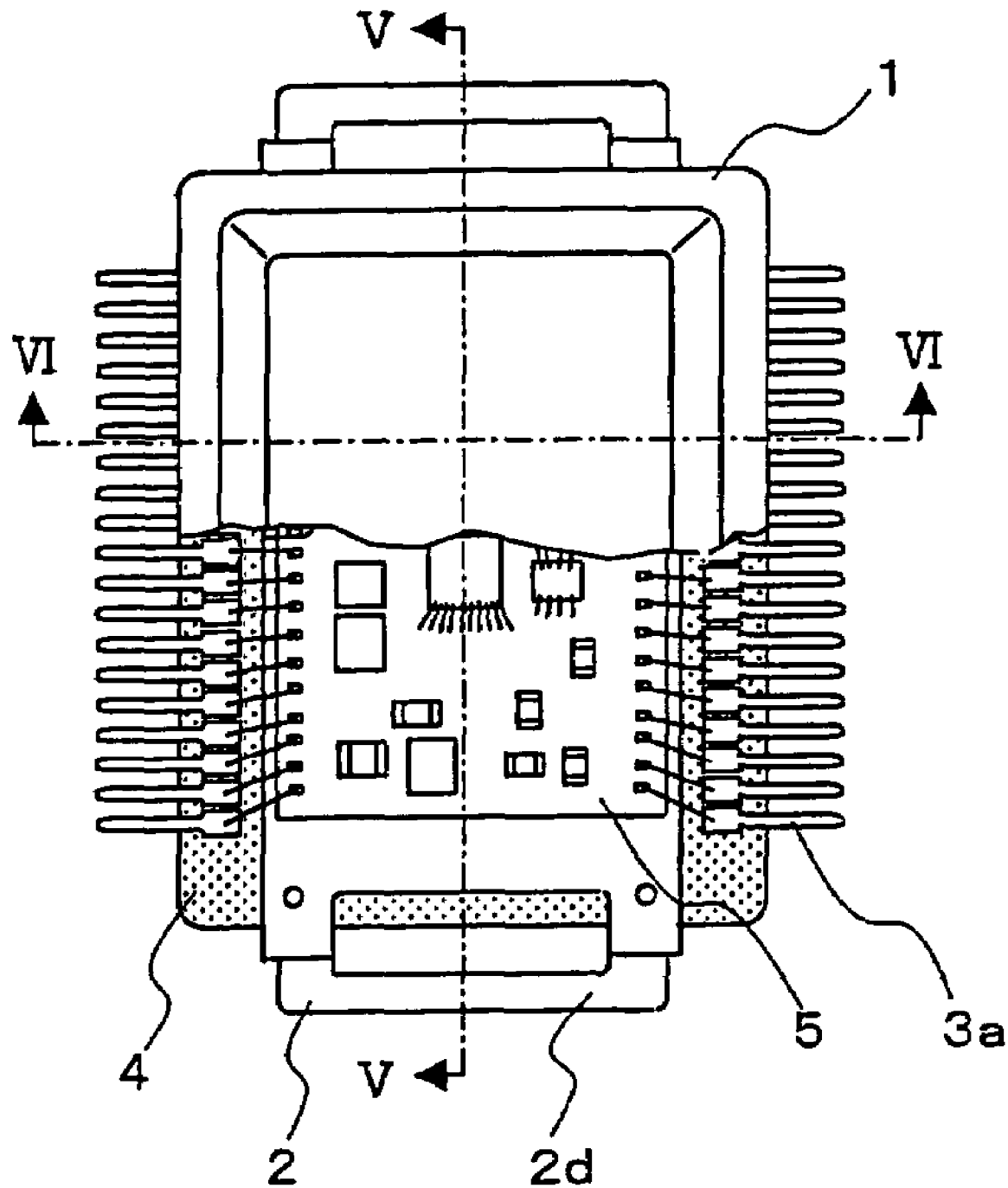
FIG. 30 is a plan view showing of the electronic circuit device for car use of the present invention which is partially sectioned crossly.
Figure 31:
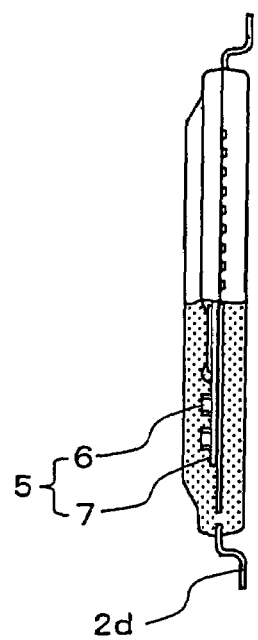
FIG. 31 is a partial longitudinal side view along the line V—V shown in FIG. 30.
Figure 32:
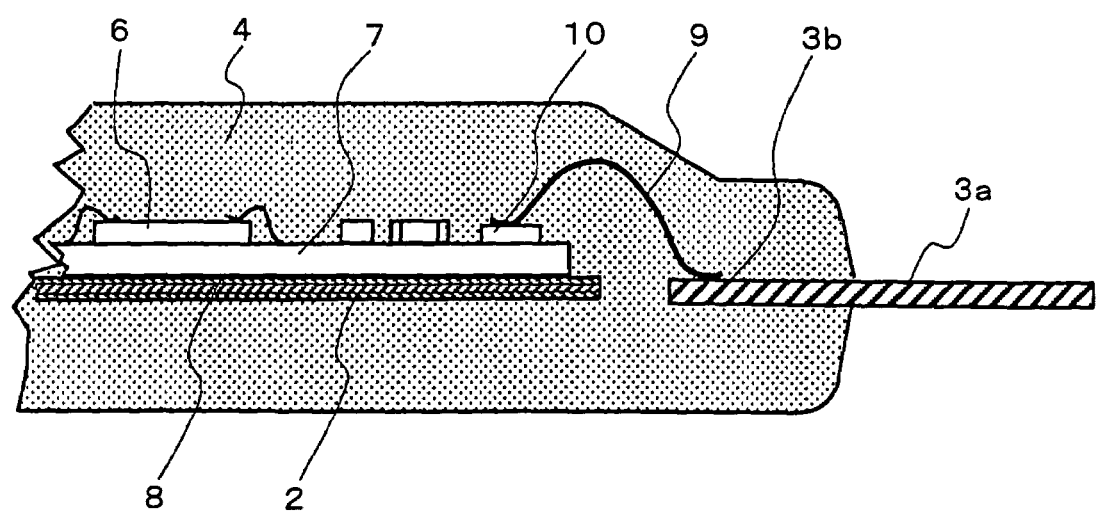
FIG. 32 is a partial transverse side view along the line VI—VI shown in FIG. 30.

FIGS. 30 to 51 are drawings showing another embodiment of the electronic circuit device of the present invention. FIG. 30 is a plan view of an electronic circuit device (control unit) for car use 1 and FIGS. 31 and 32 are cross sectional views respectively along the lines V—V and VI—VI, that is, partial cross sectional side views in different view directions.

On the base 2 having the flange 2d, the electronic circuit assembly 5 composed of the circuit elements 6 and the circuit substrate 7 is loaded. In this case, the circuit substrate 7 is adhered to the base 2.

The lead terminals 3a are used to electrically connect an external connecting object (not shown in the drawing) and the lead terminals 3a are fit into the harness connectors of the external connecting object or welded to the harness terminals.

The electronic circuit assembly 5 and the lead terminals 3a are electrically connected by the wire bonding method such as thermal contact bonding or ultrasonic waves via the thin aluminum wires 9. The electronic circuit assembly 5 is adhered onto the base 2, and the electronic circuit assembly 5 and the lead terminals 3a are connected by the thin aluminum wires 9, and then the components such as the electronic elements 6, the circuit substrate 7, the base 2, and the lead terminals 3a are embedded in a batch in the mold resin (hereinafter, referred to as sealing resin) 4 excluding a part of the lead terminals 3a and a part of the flange 2d.

The sealing resin 4 is manufactured by transfer molding. The transfer molding is generally a method using thermo setting resin such as epoxy resin as sealing resin and tablet-shaped epoxy resin formed by compression-molded powder is fused by applying predetermined pressure at a predetermined temperature and is fluidized and cured in a mold. The method is widely adopted as a package of a chip such as an LSI (large scale integrated circuit).

The sealing resin 4 has a low linear expansion coefficient and overall packs the internal parts. The sealing resin 4 is given an optimal physical property in order to always keep the adhesive force with the internal parts at a predetermined value and to prevent the soldered parts and the thin wire bonding connections between the semiconductor chips and the circuit substrate from separation and disconnection due to heat stress.

For an electronic circuit device for car use, entry of water and oil from the respective adhesive boundary surfaces between the sealing resin 4 and the lead terminals 3a and base 2 due to repetitive heat stress during operation is worried about.

The respect can be solved by a method for making the difference in linear expansion coefficient between the lead terminals 3a and base 2 and the sealing resin 4 smaller inasmuch as is possible, reducing the heat stress between the members, performing a special surface treatment, for example, the aluminum chelate treatment to the lead terminals 3a and the base 2, and covalent-bonding the boundary part between the resin and the member.

For the lead terminals 3a, a heat conductive copper or copper series alloy material is selected. For the circuit substrate 7, a material having a comparatively small linear expansion coefficient such as ceramics or glass-ceramics is selected so as to form a predetermined circuit pattern. For the base 2 to which the circuit substrate 7 is adhered, a material whose linear expansion coefficient is close to those of the circuit substrate 7 and the sealing resin 4 is selected.

For example, a material that copper is laminated on both sides of Invar (alloy of 64% iron—36% nickel), the so-called cladding material is selected, and the thickness ratio between both metals is changed, thus a desired composite linear expansion coefficient can be obtained. Meanwhile, with respect to a single material, the linear expansion coefficient of Invar is about 1 ppm/° C. and that of copper is 16.5 ppm/° C.

To mage the linear expansion coefficient smaller, the copper part is made thinner and the Invar part is made thicker. Therefore, in this embodiment, for example, when the linear expansion coefficient of the circuit substrate 7 is 7 ppm/° C. and the linear expansion coefficient of the sealing resin 4 is 8 ppm/° C., the linear expansion coefficient of the cladding material is set to 6.7 ppm/° C.

As an example of a cladding material having this linear expansion coefficient, when the base 2 is 0.64 mm in thickness, the thicknesses of copper and Invar are respectively 0.128 mm and 0.384 mm.

When the linear expansion coefficient of the cladding material which is close to the linear expansion coefficients of the circuit substrate 7 and the sealing resin 4 is set to 6.7 ppm/° C., the mutual difference in linear expansion coefficient becomes smaller, and the heat stress due to the use environment conditions, particularly repetitive temperature changing is reduced, and the resistance for cracking of the sealing resin 4 and separation of the adhesive boundary surfaces with the members is increased.

The cladding material is composed of soft copper and hard Invar which are laminated, so that a problem arises that the difference in hardness between the materials is large and the press-cutting quality is bad. Generally, in press-cutting, the press-cut face is formed in a predetermined shape composed of a dull edge, a shear plane, and a break plane.

However, press-cutting the cladding material is equivalent to simultaneously press-cutting thin plates, which are large in hardness difference and different in thickness, in layers, and the dull edges, shear plane, and break plane become obscure, so that a problem arises that the inter-plate joint is apt to separate on the press-cutting end face.

For example, the hardness of Invar is 200 Hv (Vickers hardness) and the hardness of copper is about 100 Hv. However, the lead terminals 3a are in a shape that many narrow parts are arranged, so that highly precise press-cutting is difficult.

As a countermeasure to it, in this embodiment, for the base 2 in a simple shape requiring no high precision, a cladding material is used, and for the lead terminals 3a requiring high precision, a copper or copper alloy material is used, and the two are plastically combined.

It is a general lead frame structure to integrally press-cut the base 2 and the lead terminals 3a with the same copper alloy material. However, the linear expansion coefficient thereof is 17 ppm/° C. or so and larger than those of the circuit substrate 7 and the sealing resin 4.

Therefore, due to repetitive heat stress when in use, resin cracking and separation of the adhesive boundary surface with resin are easily generated. Particularly, the base 2 has a wide area and the heat stress acting on the adhesive boundary surface with the sealing resin 4 is large. The lead terminals 3a have a small area, so that the heat stress is on an unquestionable level.

FIG. 32 is a cross sectional view of the essential section of the electronic circuit device and on the top of the base 2, the circuit substrate 7 is adhered with the adhesive 8. In a structure of adhering the overall, it is difficult to closely adhere the boundary surface between the adhesive and the member and an air layer may be formed on the boundary surface during curing of the adhesive or many minute air bubbles may remain in the adhesive.

Therefore, a problem is apt to arise that air bubbles are expanded and crushed due to heat in the transfer mold process and the boundary surface is separated in the neighborhood of the adhesive boundary surface between the adhering part and the sealing resin 4. An example of the adhering method for solving this problem will be described later.

On the circuit substrate 7, a wiring pattern not shown in the drawing is formed and the circuit elements 6 and the bonding pads 10 are soldered. To the bonding pads 10 and the lead terminals 3a, the thin aluminum wires 9 are electrically connected respectively by the wire bonding method such as heat contact bonding or ultrasonic waves.

The material of the circuit substrate 7 is preferably a material having a linear expansion coefficient close to that of the silicone chips occupying the majority of the circuit elements 6 and a small difference in linear expansion coefficient from that of the sealing resin 4. When the circuit scale is increased, a multi-layer circuit substrate is preferable for miniaturization and a ceramic or glass-ceramic substrate is suitable. When giving priority to heat dissipation, a ceramic substrate having large thermal conductivity is preferable.

Figure 33:
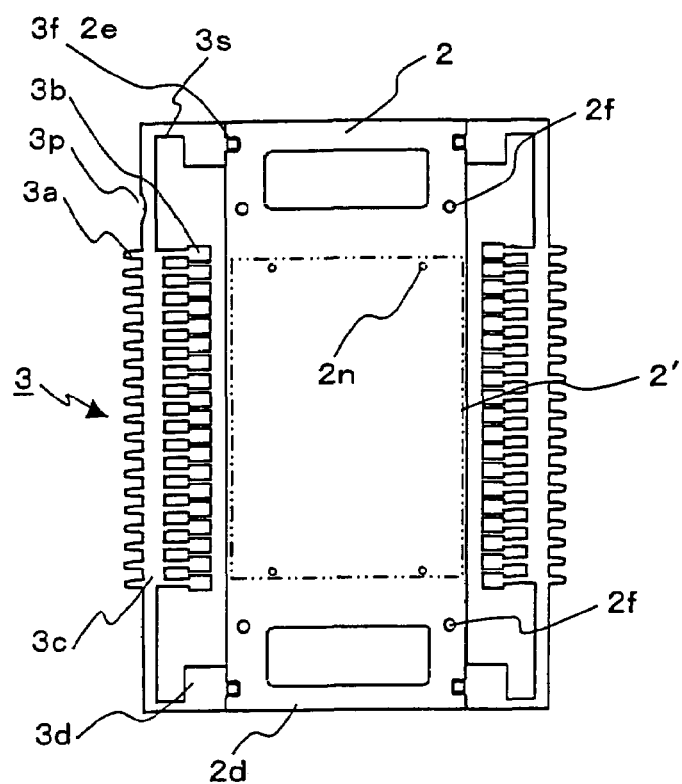
FIG. 33 is a plan view showing the integral shape of the lead frame and base.

FIG. 33 is a drawing showing the base 2 and the lead frame 3 which are joined and integrated. The base 2 has a shape composed of the substrate adhering part 2', the flanges 2d, the joints 2e, the positioning holes 2f, and the projections 2n.

The lead frame 3 is composed of the lead terminals 3a, the bonding pads 3b, the connections 3c, the frames 3d, the joints 3f, and the stress absorbers 3s, and the notches 3p, which are all manufactured by press-cutting. And, the parts are plastically combined and integrated with the joints 2e and 3f. The combining method, effects of the stress absorbers 3s, and another shape example will be described later.

The bonding pads 3b for connecting the thin aluminum wires 9 by wire bonding are partially plated with nickel or silver to prevent the surface thereof from oxidation. The flanges 2d are installed to fix to the opposite members and the four holes 2f are installed to position the jigs at the time of assembly.

The notches 3p decide the directivity and are installed in order to reduce fitting errors to the transfer mold caused by manufacturing errors. Further, the notches 3p also accomplish an object of preventing an assembly in a state that the circuit substrate 7 is adhered and the wire bonding operation for the electronic circuit assembly 5 is finished via the predetermined process from inserting in the opposite direction when it is to be set in this mold. For the notches 3p, when the lead frame 3 is in a symmetrical shape, a shape and a position may be optionally selected so as to discriminate the front and rear thereof.

Further, the reason that the connections 3c, the frames 3d, and the flanges 2d constitute a closed loop is that when the part is clamped from top and bottom by the transfer mold, thereby is transfer-molded with the sealing resin 4 and epoxy resin is fused in the mold to a liquid, it is prevented from leaking outside the closed loop.

Between the narrow part of the lead terminal 3a to be fit and the mold, a fitting gap is formed, so that liquid epoxy resin leaks outside through this part. However, since the closed loop is structured, it is cured in the loop and then remains as burrs.

And, after the molding, the burrs are removed, and the connections 3c and the frames 3d of the lead frame 3 are cut off, and a plurality of independent lead terminals 3a are formed, and the flanges 2d of the base 2 are punched and folded in a predetermined shape, thus the control unit 1 is completed.

Figure 34:
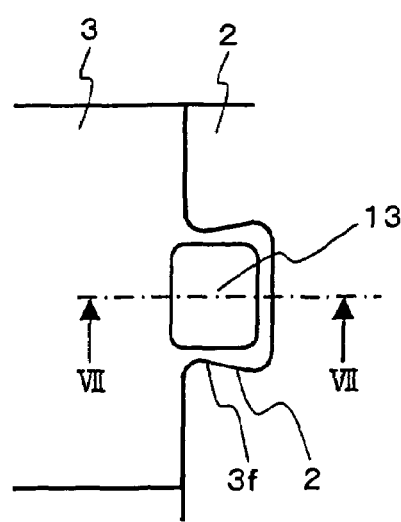
FIG. 34 is a detailed diagram showing the joint shown in FIG. 33.
Figure 35:
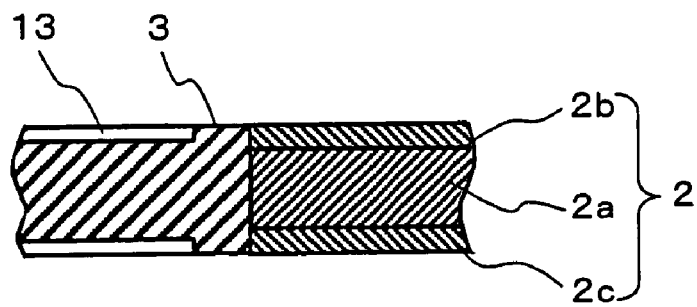
FIG. 35 is a cross sectional view along the line VII—VII shown in FIG. 34.
Figure 36:
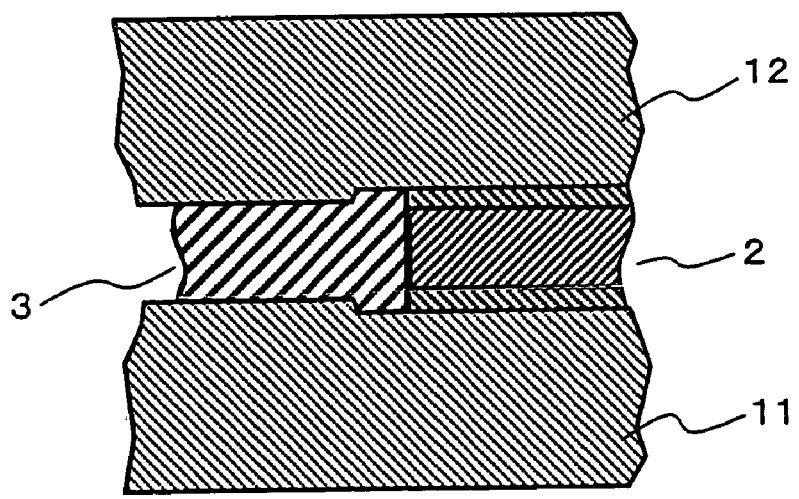
FIG. 36 is a cross sectional view showing a method for forming a concavity for joining.

FIG. 34 is a detailed diagram of an example of the joined portion of the base 2 and the lead frame 3 and FIG. 35 is a cross sectional view of the joined portion along the line VII—VII shown in FIG. 34.

The joints 2e provided on the base 2 are concave and are fit to the convex joints 3f of the lead frame 3. The concave and convex joints are partially inclined so as to stop in the plane direction.

And, by application of the press load, the joints 3f are crushed in the thickness direction, and concavities 13 are formed, and the joints are joined by plastic flow of the material. Even if the concave and convex shapes of the joints are reversed, the same joint effect can be obtained.

The Invar 2a is harder than the lead frame 3, so that even if the convex joints 3f formed on the lead frame 3 are crushed, there is no problem. However, particularly when the material of the lead frame 3 is a copper alloy comparatively soft, and the Invar part 2a is thin, and the copper parts 2b and 2c are thick, if concave joints are formed on the base 2, a problem arises that the joints are opened outside.

Therefore, according to the thickness ratio between the copper and Invar cladding materials and the material hardness of the lead frame 3, the concavities 13 must be formed in either of the lead frame 3 and the base 2.

In this embodiment, in consideration of it, for the lead frame 3, a material lower in hardness than the Invar part 2a of the cladding material is selected. As an example, the material is a copper alloy of 150 Hv. (Vickers hardness).

The cladding material of the base 2 is composed of Invar 2a and copper 2b and 2c and as is generally known, they are applied with predetermined pressure at a predetermined temperature, laminated, and strongly joined by diffusion between the metallic materials.

The convex joints of the lead frame 3 are crushed, and the concavities 13 are formed up and down, thus the material is plastically flowed, and the fitting gaps in the plane direction are filled up, and the base 2 and the lead frame 3 are joined.

Figure 41:
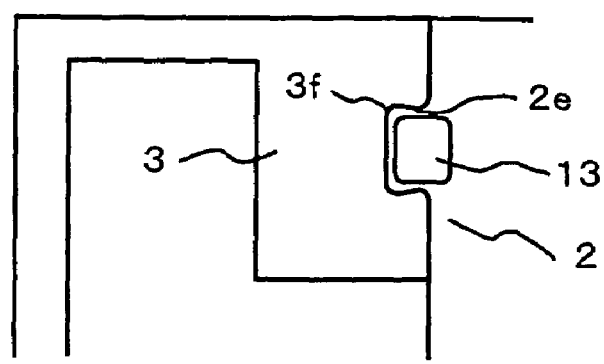
FIG. 41 is a detailed diagram showing an example of the joint.

An example of a method for forming the concavities 13 is shown in FIG. 41. A lower die 11 and an upper die 12 are in a stepped shape. When a load is applied in the vertical direction, the convex joints 3f of the lead frame 3 are crushed and the concavities 13 are formed.

The press condition under which the stepped parts of the dies 11 and 12 make contact with the top and bottom of the lead frame 3 and the top and bottom of the base 2 when a predetermined load is applied is set. When the stepped parts do not make contact with them, the copper parts 2b and 2c locally swell in the thickness direction in the neighborhood of the fit part and may be warped in the thickness direction. Further, the concavities 13 are multilateral. However, they may be formed in any shape including a circular shape or a trapezoidal shape along the inclined part.

In the drawing, the materials are the same in thickness. However, the base 2 or the lead frame 3 may be thicker than the other. When heat dissipation must be increased, it is effective to make the base 2 thicker. Further, when the lead terminals 3a are to be connected to the connectors, they can be fit to the proper thicknesses of the opposite female terminals.

Figure 37:
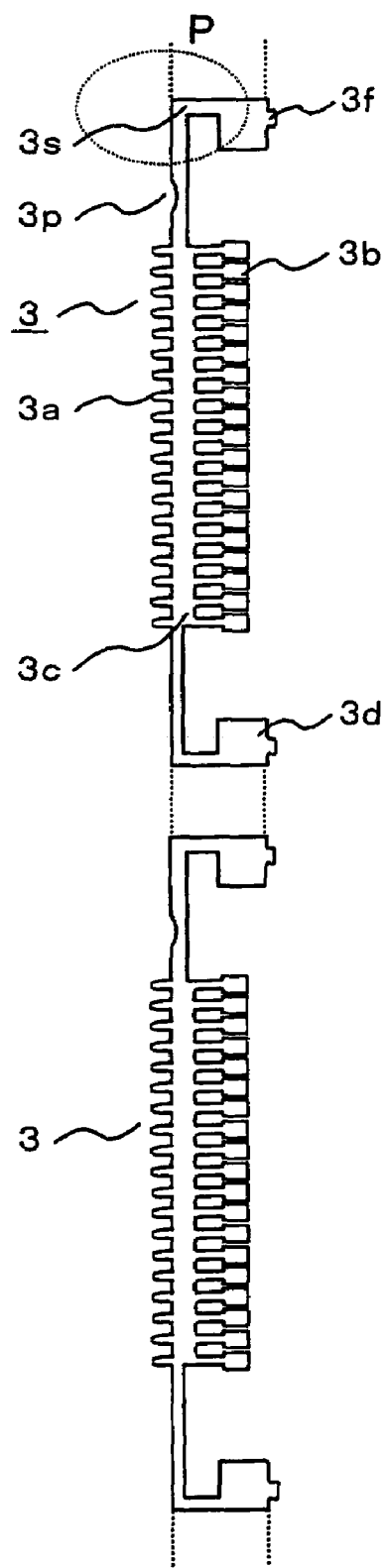
FIG. 37 is a plan view showing one shape of the lead frame.
Figure 38:
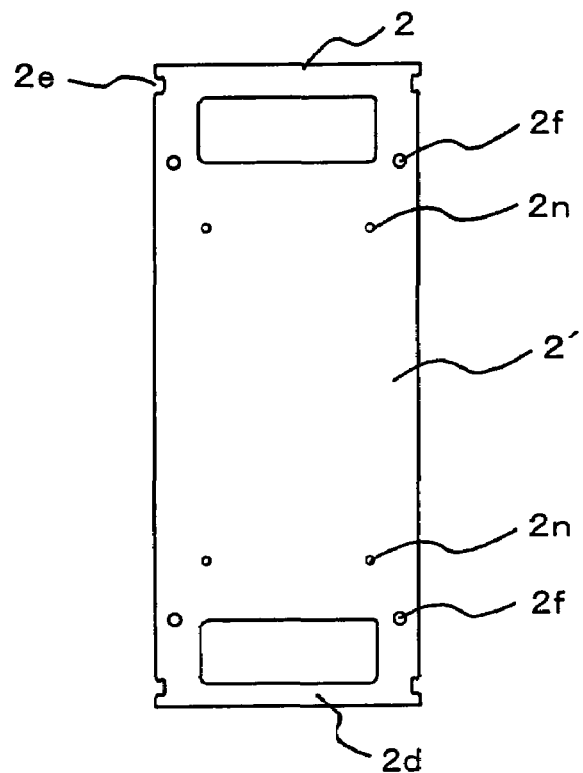
FIG. 38 is a plan view showing one shape of the base.

FIG. 37 is a plan view showing the shape of the lead frame 3 before packaging, and FIG. 38 is a plan view showing the shape of the base 2 before packaging, and they are respectively manufactured by press-cutting.

The lead frame 3 has the lead terminals 3a, the bonding pads 3b, the connections 3c, the frames 3d, the stress absorbers 3s, the notches 3p, and the joints 3f. The parts connected by dotted lines are empty parts for continuous press-cutting.

The bonding pads 3b require nickel plating or silver plating for oxidation prevention. However, the bonding pads 3b in a material state before press-cutting may be partially plated in a belt shape or the bonding pads may be partially plated after press-cutting.

The base 2 has the substrate adhering part 2' where the electronic circuit assembly 5 is loaded and fixed, the joints 2e with the lead frame 3, the flanges 2d, the positioning holes 2f, and the projection 2n. In the same way as with the lead frame 3, the base 2 may be shaped so as to provide empty parts for continuous press-cutting.

As mentioned above, the base 2 and the lead terminals 3a are manufactured by different kinds of materials and then the two are integrated by plastic combination, so that depending on the physical properties of the circuit substrate 7 and the sealing resin 4, the required level for heat dissipation, and the opposite connector terminals, the materials of the base and lead terminals can be selected according to an optimal linear expansion coefficient, thermal conductivity, and thickness. Therefore, this is a great effect which cannot be realized by the conventional apparatus that the base and lead frame are composed of the same copper alloy material.

Next, the operation of the stress absorbers 3s aforementioned will be explained.

The base-lead frame assembly with the base 2 and the lead frame 3 joined, when passing through a reflow furnace which will be described later, is exposed to a high temperature such as 2 hundreds several tens° C. for several minutes. The lead frame 3 is composed of copper or copper alloy, and the linear expansion coefficient thereof is about 17 ppm/° C., and the linear expansion coefficient of the base 2 is 6.7 ppm/° C., and the heat stress according to the difference in linear expansion coefficient and difference in temperature between the two is acted on the joint.

In the state joined at room temperature, the base 2 and the lead frame 3 are formed on the same plane. However, the linear expansion coefficient of the lead frame 3 is larger than that of the base 2, so that the lead frame 3 tends to extend outward.

However, the lead frame 3 is controlled by the joint, so that stress is acted on the part and when the stress is excessive, force is acted so at to twist the base 2. The difference in linear expansion coefficient between the circuit substrate 7 and the base 2 is small, so that little warp is generated due to the heat stress. However, when force due to a twist is applied, the adhered part is apt to separate.

The heat stress is absorbed by the stress absorbers 3s. The stress absorbers 3s are formed narrower than the other parts of the frame, causes a twist to the lead frame 3, and prevents the base 2 from deformation (twist) due to the extension. Even if the lead frame 3 is twisted, it returns to its original state at room temperature, so that no actual harm is caused. However, the base 2 must be prevented from a twist.

Figure 39:
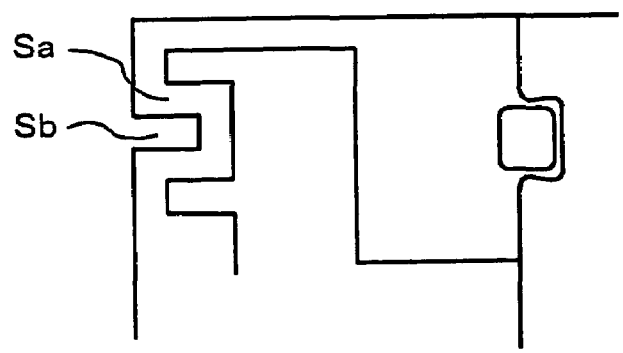
FIG. 39 is a plan view showing an example of the stress absorber of the lead frame.
Figure 40:
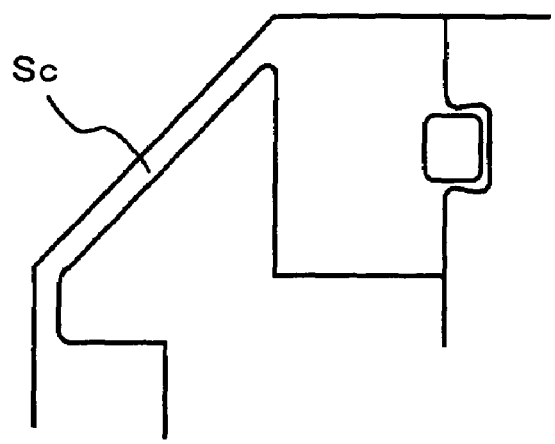
FIG. 40 is a plan view showing another example of the stress absorber of the lead frame.

The part P enclosed by a dotted line showing the shape of the stress-absorber 3s shown in FIG. 37 may have various shapes as shown in FIGS. 39 and 40. FIG. 39 shows a shape that a narrow part Sa and a slit Sb are provided.

FIG. 40 shows a shape that an inclined narrow part Sc is provided. In consideration of the material, thickness, and size of the lead frame 3, a suitable shape is selected. The shape is not limited to the shapes shown in the drawings and an optional shape can be selected.

FIG. 41 is a detailed diagram showing another concrete example of the joint and it corresponds to the joined portion shown in FIG. 34. The joint 3f of the lead frame 3 are made concave, and the joints 2e of the base 2 are made convex, and the convex parts are crushed, and the concavities 13 are formed, and the lead frame 3 and the base 2 are plastically combined.

When the material of the lead frame 3 is a copper alloy comparatively hard, and the Invar part 2a is thin, and the copper parts 2b and 2c are thick, this structure is suitable and the concavities 13 are formed in the copper parts 2b and 2c.

Figure 42:
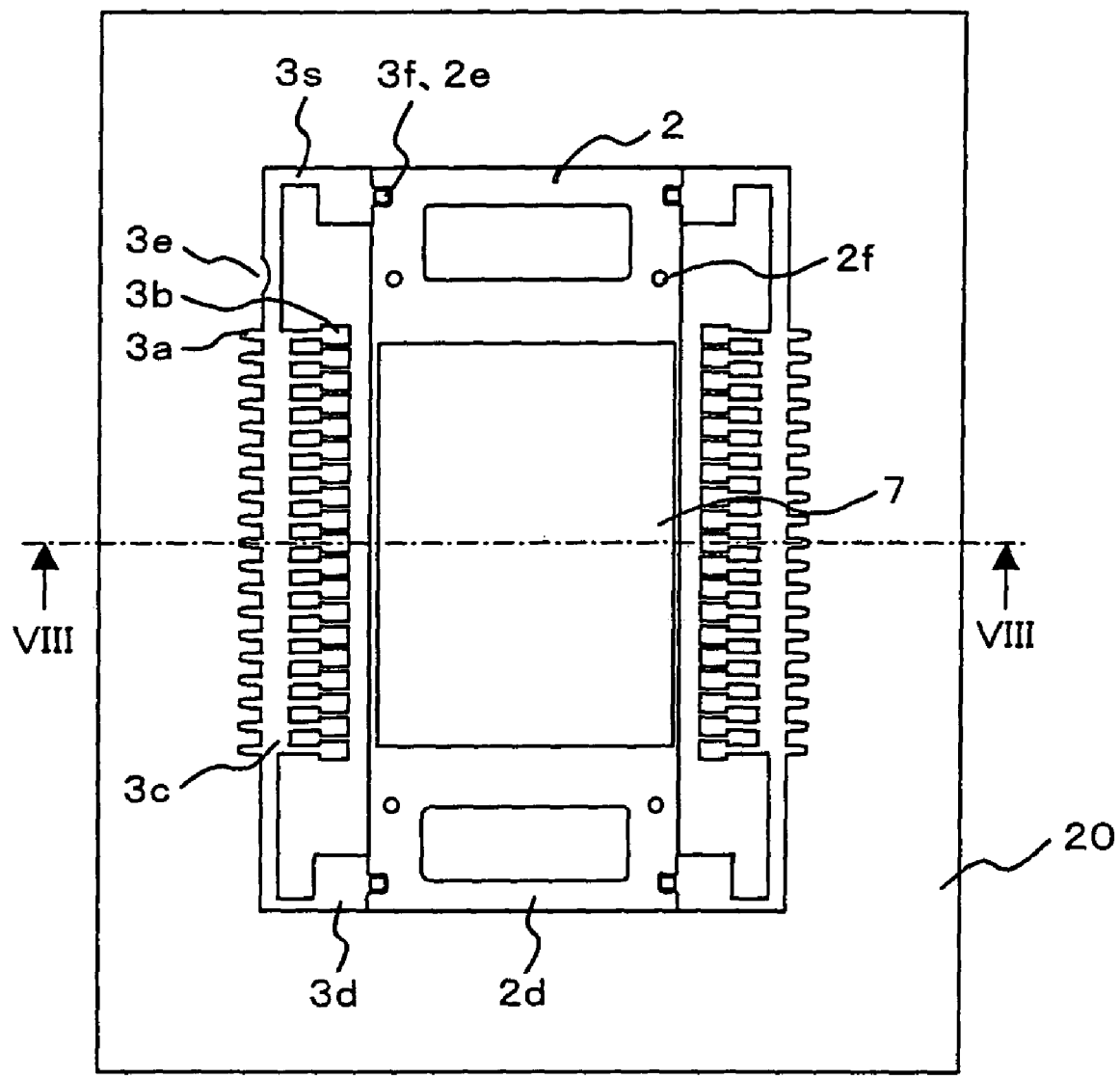
FIG. 42 is a plan view showing the jig for adhering the circuit substrate and adhering operation.
Figure 43:
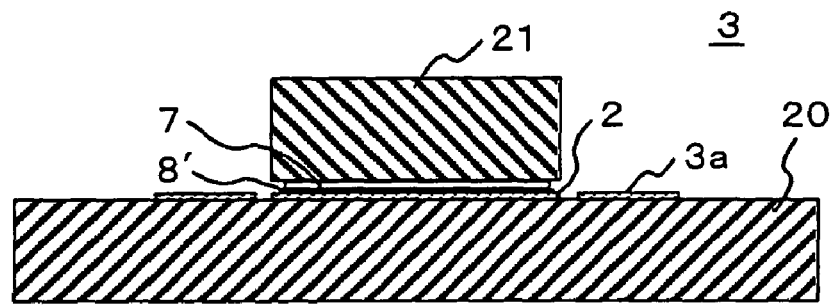
FIG. 43 is a cross sectional view along the line VIII—VIII shown in FIG. 42.

FIG. 42 is a plan view showing an example of a jig for adhering the circuit substrate 7 and FIG. 43 is a cross sectional view of the jig along the line VIII—VIII.

In a structure of adhering the overall, it is difficult to closely adhere the boundary surface between an adhesive and a member and an air layer may be formed on the boundary surface during curing of the adhesive or many minute air bubbles may remain in the adhesive.

However, in the adhering operation process, by a method that for example, an epoxy adhesive sheet with a thickness of several tens μm is used for the adhesive 8 and a pressing load is applied from the top of the circuit substrate 7 at a predetermined temperature for a predetermined time, the aforementioned problem can be solved.

Firstly, on the top of an adhering jig 20, an assembly that the base 2 and the lead frame 3 are joined is loaded. An adhesive sheet 8' is put on the base 2 and the circuit substrate 7 is loaded thereon. And, a load is applied to the top of the circuit substrate 7 by a jig 21. In this state, the adhesive sheet 8' is fused and cured at the predetermined temperature for the predetermined time and the adhering process is finished.

The material of the circuit substrate 7 is glass-ceramics or ceramics, so that the Young's modulus of elasticity thereof is high and when a load is applied, the material is easily cracked. Therefore, for the adhesive sheet 8', in consideration of this respect, an adhesive having physical properties which can be fused and cured at a low load is selected.

Further, to prevent the conductor pattern formed on the circuit substrate 7 from scratching and the protective glass film from cracking, attention must be given such that as an irregularity absorbing material, for example, a polyester resin film is loaded on the circuit substrate 7 or elastic heat-resistant resin is coated on the surface of the jig 21.

Further, when the warp of the base 2 is large and the load is applied in the aforementioned adhering process, the adhesive is cured in a state that the warp is corrected and when the load is removed, the stress for returning the warp due to correction to the original state acts on the adhered part.

Therefore, a problem arises that the adhesive boundary surface is separated by the stress. Even if the boundary surface is not separated at room temperature after ending of adhesion, particularly in the process of joining the electronic circuit elements 6 with solder, the elements pass through a solder reflow furnace at 2 hundreds several tens° C., so that a reduction in the adhesive strength is added, thus separation is apt to generate.

To prevent it, a polyester resin film is loaded on the adhering jig 20 and positioned so as to touch the bottom of the base 2. Thereby, the correction amount of the warp can be reduced. However, when the warp is too large, the prevention effect is lost, so that to control the warp to a predetermined value or less, the manufacturing accuracy of the base 2 must be controlled.

Next, a selection example of the adhesive sheet 8' will be explained.

The thickness of a sheet composed of a main component of epoxy series adhesive is set to 50 to 200 μm and the area thereof is slightly narrower than that of the circuit substrate 7. Generally, this kind of sheet-like adhesive has a structure that both sides thereof are held by a polyester resin film with a thickness of several tens μm.

The film on one side is separated, and the side is loaded on the base 2, and the base 2 is pressed by a roller from the top thereof via the film on the other side or pressed by a press so as to execute temporary adhesion. In this case, under a perfect curing condition such as at 150° C. for 1 hour, the base 2 is pressed in an atmosphere of 50° C. for several seconds and temporarily adhered, and the film on the opposite surface is separated, and the circuit substrate 7 is loaded on it and heated and pressed at 150° C. for 3 minutes as primary adhesion, and then actually cured at 150° C. for 1 minute without pressurization. Further, the operation may be moved to the primary adhering process without executing temporary adhesion.

As already described in a liquid adhesive, an air layer may be formed on the boundary surface during curing of the adhesive or many minute air bubbles may remain in the adhesive. However, by curing a sheet-like adhesive at high temperature with pressure applied, this problem can be solved.

Figure 44:
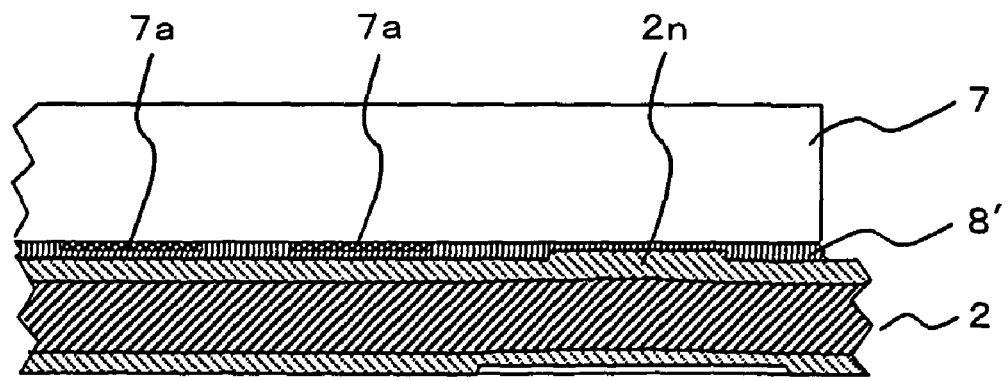
FIG. 44 is a detailed cross sectional view of the adhering part including the projection formed on the base.

FIG. 44 is a detailed cross sectional view of the adhering part including the projection 2n provided on the base 2.

In the structure of this embodiment, the circuit substrate 7 is a multilayer substrate of ceramics or glass-ceramics and also on the rear (lower surface) thereof, a circuit pattern and print resistors are formed.

As is generally known, the resistance after printing has an error of several tens %, so that to control the resistance within predetermined accuracy, a trimming operation is performed. To perform this operation, independent conductor patterns are formed for the respective resistors and measuring the resistances between the patterns, the resistors are trimmed using the heat of a laser beam.

After ending of the trimming operation, the trimming patterns are exposed and the other parts are covered with a protective film. Epoxy resin is used for the protective film. The reason that the trimming patterns are exposed is that the resistance is measured in the state after completion and the patterns are used for quality control of a manufacturer and lot control for acceptance inspection of a delivery destination.

Further, when low-melting point glass is used for the protective film, the resistors are printed and calcined and then in a predetermined region on the rear with the trimming patterns removed, a protective film is continuously formed. And, the trimming operation is performed by simultaneously fusing the low-melting point glass and resistors by the heat of a laser beam using the trimming patterns in the same way.

Since the trimming patterns are exposed, when the circuit substrate is to be adhered to the base 2, the exposed face must be prevented from touching the base 2 and a predetermined insulating distance must be obtained. In FIG. 44, the trimming patterns 7a are formed on the rear of the circuit substrate 7. The projection 2n is formed on the copper part 2b of the cladding material of the base 2 and it is provided to obtain the insulating distance.

Figure 45:
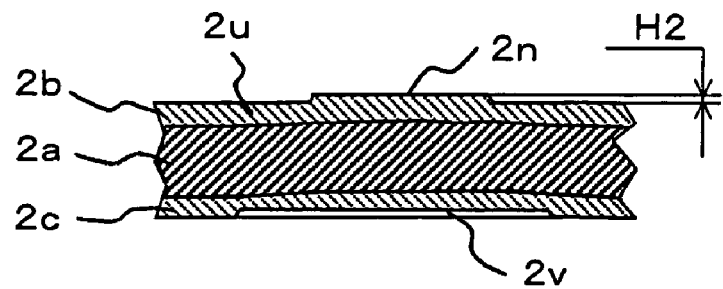
FIG. 45 is a cross sectional view showing the detailed projection.
Figure 46:
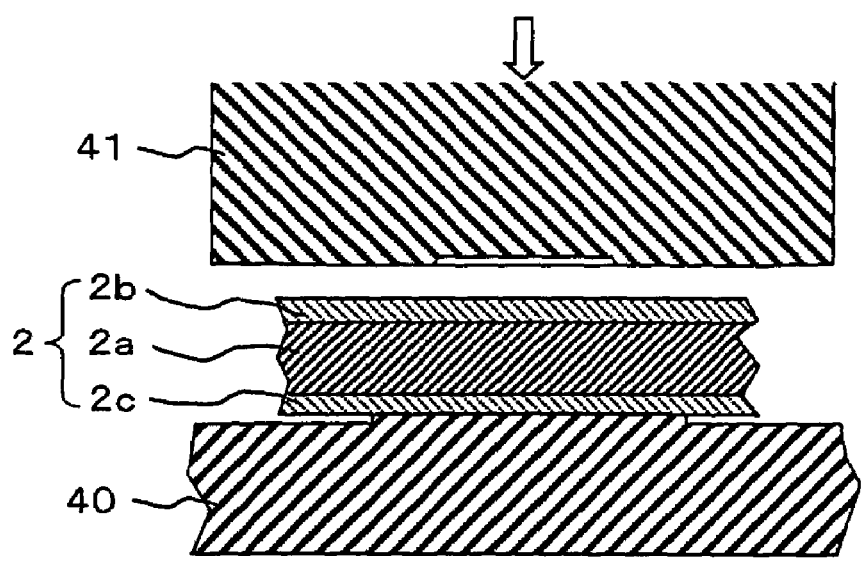
FIG. 46 is a cross sectional view showing the method for forming the projection.
Figure 47:
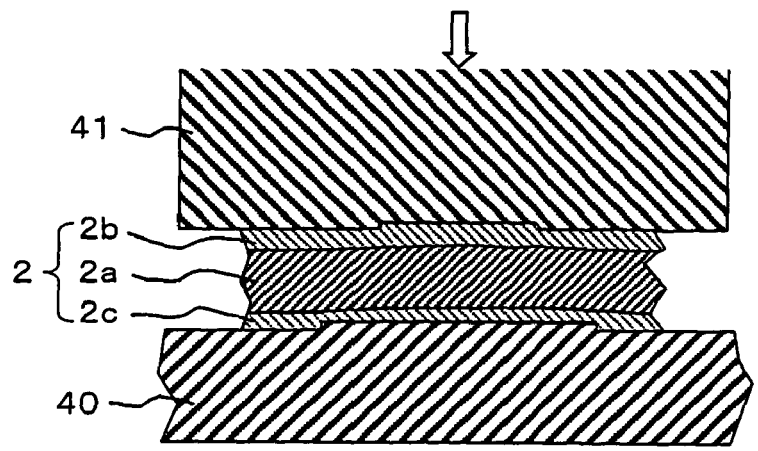
FIG. 47 is a cross sectional view showing the press-cutting state when forming the projection.

FIG. 45 is a drawing showing the projection 2n in detail, in which numeral 2u indicates a concavity, 2v a concavity on the opposite surface of the base 2 to the projection 2n, and H2 a height from the top of the base 2 to the projection 2n. A method for forming them will be explained by referring to FIGS. 46 and 47.

The base 2 is loaded on a lower die 40 and is pressed by an upper die 41 in the direction of the arrow. The upper die 41 is provided with a concavity and the lower die is provided with a convexity. Therefore, by the press load, the concavity 2v is formed on the lower side copper part 2c and simultaneously, the upper side copper part 2b is plastically flowed, and the projection 2n is formed.

The height H2 of the projection 2n is set to a size with which when the adhesive sheet 8' is loaded on the circuit substrate 7 and is heated and pressed in the primary adhering process, the trimming patterns 7a do not touch the base 2 and a predetermined insulating distance is obtained, for example, 50 μm or so. Further, the diameter of the projection 2g is 1 mm or so.

As shown in FIG. 33, the projections 2n are provided at four locations and positioned in the neighborhood of the ends of the circuit substrate 7. In the neighborhood of the ends, the rear pattern of the circuit substrate 7 is not formed. The protective film is greatly different in thickness depending on the location and when the projections 2n are positioned in the parts including it, there is a disadvantage of great variances in the predetermined distance.

Figure 48:
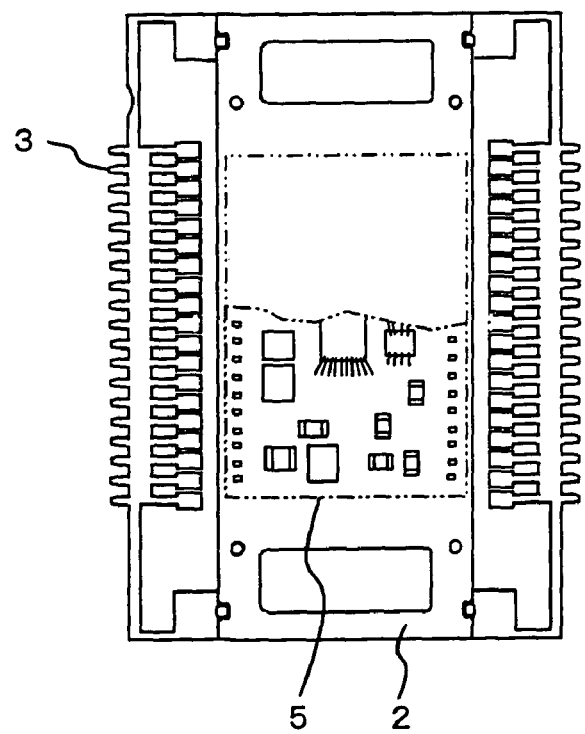
FIG. 48 is a plan view showing the state before the wire bonding operation.

After ending of the adhering process, paste solder is printed on the predetermined wiring pattern of the circuit substrate 7, and the components such as the circuit elements 6 and the bonding pads 10 are loaded, and the solder is fused in the reflow furnace and hardened at room temperature, thus the components are electrically joined. FIG. 48 shows the completed state thereof.

Figure 49:
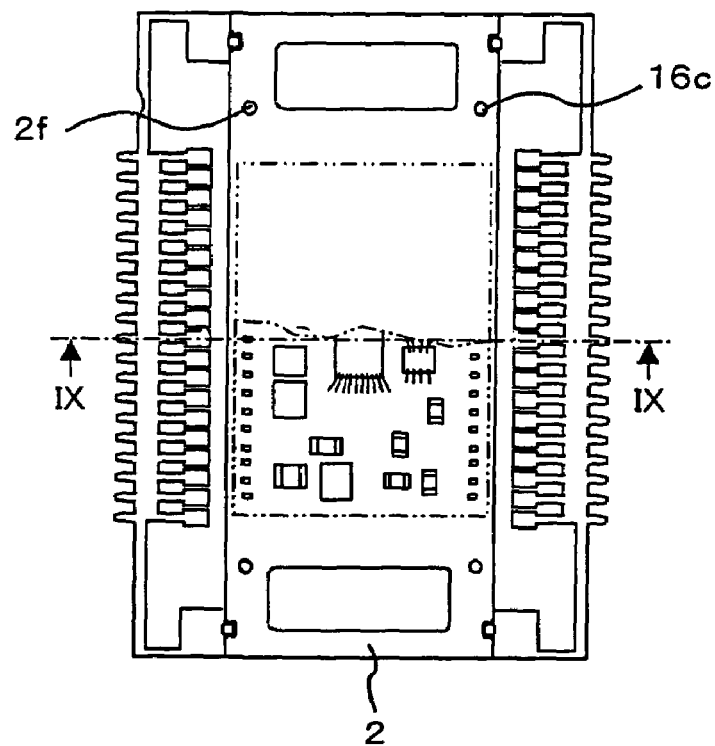
FIG. 49 is a plan view showing the jig for the wire bonding operation and operation state.
Figure 50:
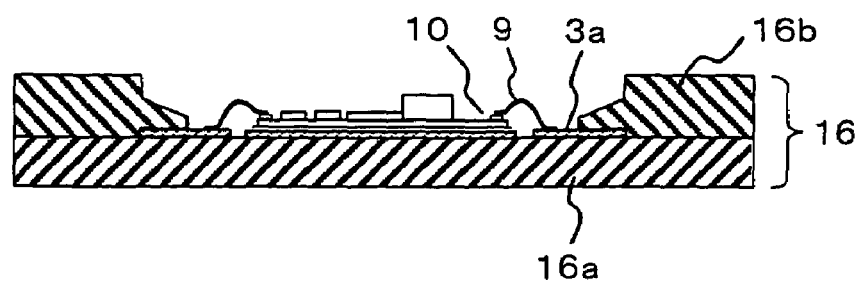
FIG. 50 is a cross sectional view along the line IX—IX shown in FIG. 49.

FIG. 49 is a plan view showing the jig for the wire bonding operation and FIG. 50 is a cross sectional view of the jig along the line IX—IX shown in FIG. 49.

The assembly that the solder joining process is finished is loaded on the lower jig 16a of the bonding jig 16. Next, the base 2 and the lead frame 3 are pressed down by the upper jig 16b and using a clamp jig not shown in the drawing, the two are fixed not to move vertically and in the plane direction.

The wire bonding operation uses an optional method such as thermal contact bonding or ultrasonic waves and electrically connects between the bonding pads 10 and the lead terminals 3a of the circuit substrate 7 by the thin aluminum wires 9.

Figure 51:
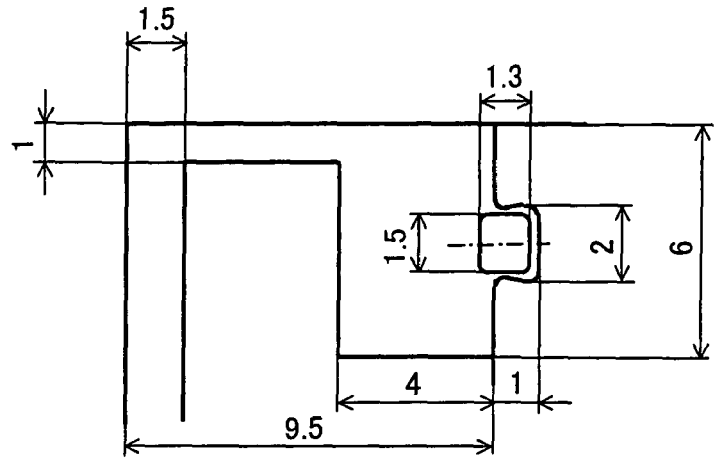
FIG. 51 is a plan view showing the detailed joint and concrete dimensions of the stress absorber.

FIG. 51 is a plan view showing the detailed joint and stress absorber. According to this embodiment, an inexpensive electronic circuit device for car use free of separation of the boundary surfaces of mold resin with the circuit substrate, base, and lead frame and cracking of the resin due to heat stress can be realized.

Still another embodiment of the electronic circuit device of the present invention will be explained by referring to FIGS. 52 to 65.

Figure 52:
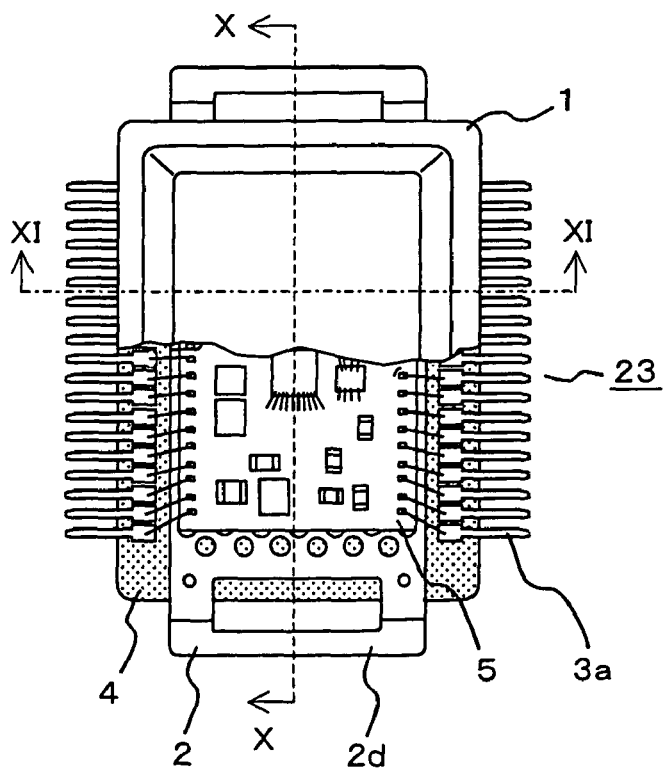
FIG. 52 is a plan view showing of the electronic circuit device for car use of another embodiment of the present invention which is partially sectioned crossly.
Figure 53:
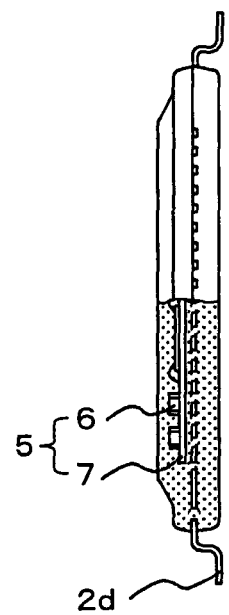
FIG. 53 is a partial longitudinal side view along the line X—X shown in FIG. 52.
Figure 54:
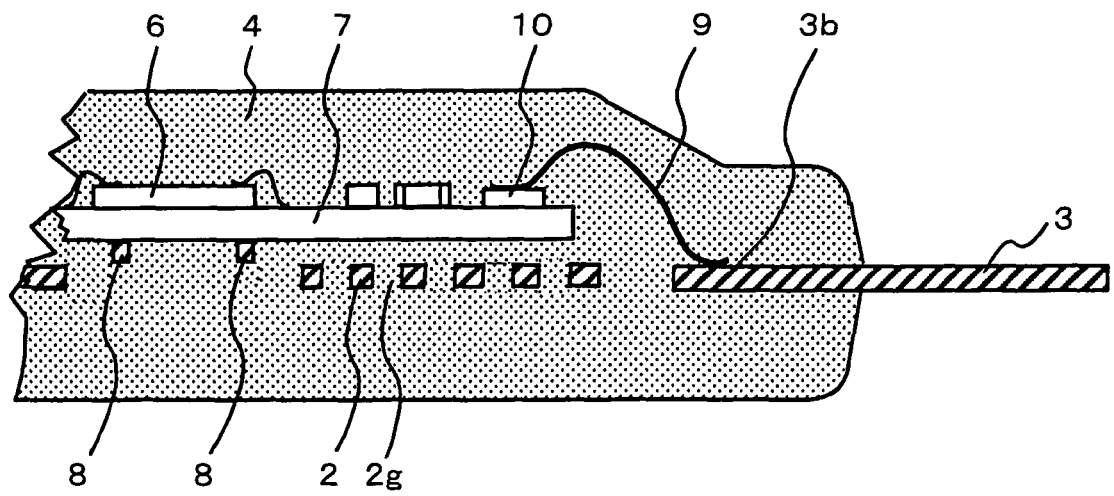
FIG. 54 is a partial transverse side view along the line XI—XI shown in FIG. 52.

FIG. 52 is a plan view of an electronic circuit device (control unit) for car use 1 and FIGS. 53 and 54 are partial cross sectional side views respectively along the lines X—X and XI—XI shown in FIG. 52 viewed in different directions.

On a lead frame unit 23 having the flange 2d, the electronic circuit assembly 5 composed of the circuit elements 6 and the circuit substrate 7 is loaded. The lead frame unit 23 is composed of the base 2 to which the electronic circuit assembly 5 is attached and the leas frame 3 for supporting the lead terminals 3a. In this loading, the circuit substrate 7 is adhered onto the lead frame unit 23. The circuit substrate 7 is structured so as to adhere only to the partially-expanded region in the central part of the base 2. The structure will be described later.

The lead terminals 3a, when electrically connected to an external connecting object (not shown in the drawing), are fit into the harness connectors of the external connecting object or welded to the harness terminals.

The electronic circuit assembly 5 and the lead terminals 3a are electrically connected by the wire bonding method such as thermal contact bonding or ultrasonic waves via the thin aluminum wires 9.

The electronic circuit assembly 5 is adhered onto the lead frame unit 23, and the electronic circuit assembly 5 and the lead terminals 3a are connected by the thin aluminum wires 9, and then the components (the electronic elements 6, the circuit substrate 7, the lead frame unit 23, and the lead terminals 3a) are embedded in a batch in the mold resin (hereinafter, referred to as sealing resin) 4 excluding a part of the lead terminals 3a and a part of the flange 2d.

The sealing resin 4 is manufactured by transfer molding. The transfer molding is generally a method using thermo setting resin such as epoxy resin as sealing resin and tablet-shaped epoxy resin formed by compression-molded powder is fused by applying predetermined pressure at a predetermined temperature and is fluidized and cured in a mold. The method is widely adopted as a package of a chip such as an LSI (large scale integrated circuit).

The sealing resin 4 has a low linear expansion coefficient and overall packs the internal parts. The sealing resin 4 is given an optimal physical property in order to always keep the adhesive force with the internal parts at a predetermined value and to prevent the soldered parts and the thin wire bonding connections between the semiconductor chips and the circuit substrate 7 from separation and disconnection due to heat stress.

For an electronic circuit device for car use, entry of water and oil from the respective adhesive boundary surfaces between the sealing resin 4 and the lead terminals 3a and lead frame unit 23 due to repetitive heat stress during operation is worried about. The respect can be solved by a method for making the difference in linear expansion coefficient between the lead terminals 3a and lead frame unit 23 and the sealing resin 4 smaller inasmuch as is possible, reducing the heat stress between the members, performing a special surface treatment (for example, the aluminum chelate treatment) to the lead terminals 3a and the lead frame unit 23, and covalent-bonding the boundary part between the resin and the member.

For the lead frame unit 23 and the lead terminals 3a, a heat conductive copper or copper series alloy material is selected.

For the circuit substrate 7, a material having a comparatively small linear expansion coefficient such as ceramics or glass-ceramics is selected so as to form a predetermined circuit pattern.

It is a general structure to integrally press-cut the base 2, the lead frame 3, and the lead terminals 3a constituting the lead frame unit 23 with the same copper alloy material. However, the linear expansion coefficient thereof is 17 ppm/° C. or so and larger than those of the circuit substrate 7 and the sealing resin 4, thus, due to repetitive heat stress when in use, resin cracking and separation of the adhesive boundary surface with resin are easily generated.

Particularly, the lead frame unit 23 has a wide area and the heat stress acting on the adhesive boundary surface with the sealing resin 4 is large. The lead terminals 2a have a small area, so that the heat stress is on an unquestionable level for the structure of this embodiment.

FIG. 54 is a cross sectional view of the essential section of the electronic circuit device and on the top of the lead frame unit 23, the circuit substrate 7 is adhered with the adhesive 8. The circuit substrate 7 is structured so as to adhere only to the partially-expanded region in the central part of the lead frame unit 23. Generally, when the substrate is to be adhered to the lead frame unit 23, a structure of overall adhesion is used. However, in this embodiment, partial adhesion is adopted.

In a structure of adhering the overall, it is difficult to closely adhere the boundary surface between the adhesive and the member and an air layer may be formed on the boundary surface during curing of the adhesive or many minute air bubbles may remain in the adhesive. Therefore, air bubbles are expanded and crushed due to heat in the transfer mold process and the boundary surface is apt to separate in the neighborhood of the adhesive boundary surface between the adhering part and the sealing resin 4.

In this structure, many small holes 2g are formed in the lead frame unit 23 and the holes are filled with the sealing resin 4. Due to existence of the small holes 2g, the lead frame unit 23 equivalent to the area of the circuit substrate 7 is composed of low rigidity.

Low rigidity provides an advantage that the heat stress due to the difference in linear expansion coefficient from the sealing resin 4 is easily absorbed and since many scattered small holes 2g are formed, the separation prevention effect on the adhesive boundary surface with the member is very great.

Furthermore, when the small holes 2g are filled with the sealing resin 4, if local separation is generated, the resin of the neighboring small holes acts as a breakwater and development of separation is suppressed. Further, a part of the small holes 2g serves as holes for jig insertion in the adhering process for the circuit substrate 7 which will be described later and in the wire bonding process of the thin aluminum wires 8.

On the circuit substrate 7, a wiring pattern not shown in the drawing is formed and the circuit elements 6 and the bonding pads 10 are joined with solder. To the bonding pads 10 and the lead terminals 3a, the thin aluminum wires 8 are respectively connected by the wire bonding method such as heat contact bonding or ultrasonic waves.

The material of the circuit substrate 7 is preferably a material having a linear expansion coefficient close to that of the silicone chips occupying the majority of the circuit elements 6 and a small difference in linear expansion coefficient from that of the sealing resin 4. When the circuit scale is increased, a multi-layer circuit substrate is preferable for miniaturization and a ceramic or glass-ceramic substrate is suitable. When giving priority to heat dissipation, a ceramic substrate having large thermal conductivity is preferable.

Figure 55:
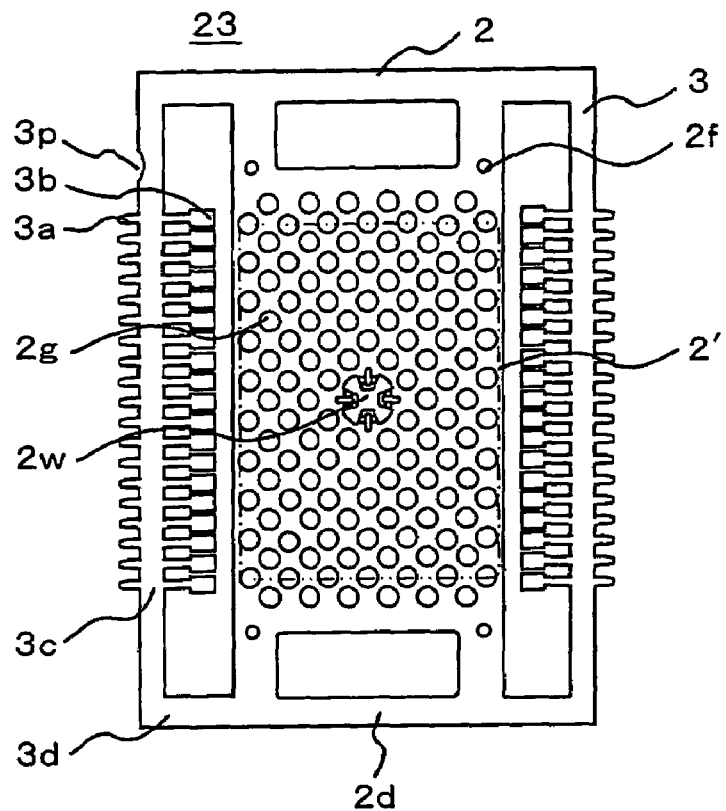
FIG. 55 is a plan view showing the shape of the lead frame.

FIG. 55 is a plan view showing the shape of the lead frame unit 23. The lead frame unit 23 has the substrate adhering part 2', the lead terminals 3a, the bonding pads 3b, the connections 3c, the flanges 2d, the frames 3d, the notches 3p, the positioning holes 2f, and many small holes 2g. The small holes 2g are scattered almost equivalent to the area of the circuit substrate 7 and realize the boundary surface separation prevention effect aforementioned.

The bonding pads 3b for connecting the thin aluminum wires 9 by wire bonding are partially plated with nickel or silver to prevent the surface thereof from oxidation. The flanges 2d are installed to fix to the opposite members and the positioning holes 2g are installed to position the jigs at the time of assembly.

The notches 2f decide the directivity and are installed in order to reduce fitting errors to the transfer mold caused by manufacturing errors. Further, the notches 2f also accomplish an object of preventing an assembly in a state that the circuit substrate 7 is adhered and the wire bonding operation is finished from vertically inserting in the opposite direction when it is to be set in this mold. For the notches 3p, when the lead frame unit 23 is in a symmetrical shape, a shape and a position may be optionally selected so as to discriminate the front and rear thereof.

Further, the reason that the connections 3c, the frames 3d, and the flanges 2d constitute a closed loop is that when the part is clamped from top and bottom by the transfer mold, thereby is transfer-molded with the sealing resin 4 and epoxy resin is fused in the mold to a liquid, it is prevented from leaking outside the closed loop.

Between the narrow part of the lead terminal 3a to be fit and the mold, a fitting gap is formed, so that liquid epoxy resin leaks outside through this part. However, since the closed loop is structured, it is cured in the loop and then remains as burrs.

And, after the molding, the connections 2c and the frames 2d of the lead frame unit 23 are cut off, and a plurality of independent lead terminals 3a are formed, and the flanges 2d are punched and folded in a predetermined shape, thus the control unit 1 is completed.

Figure 56:
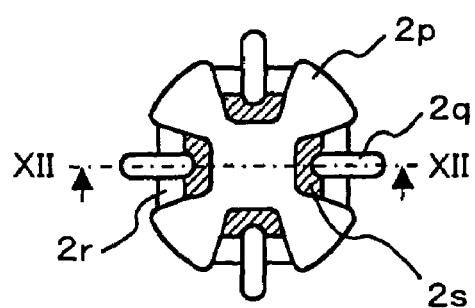
FIG. 56 is a plan view showing the detailed adhering part provided on the lead frame.
Figure 57:
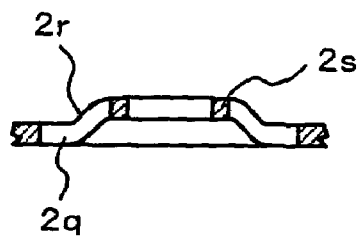
FIG. 57 is a cross sectional view along the line XII—XII shown in FIG. 56.

FIG. 56 is a plan view showing a substrate adhering part 2w provided on the lead frame unit 23 in detail and FIG. 57 is a cross sectional view thereof along the line XII—XII shown in FIG. 56.

A butterfly window 2p, a narrow small window 2q, an inclined part 2r, and an adhering region 2s extending in the horizontal direction are formed. The inclined part 2r narrows the interval between the butterfly window 2p and the narrow small window 2q, so that it has low rigidity and acts as a kind of plate spring. It is intended to produce an effect such that in the use state after the circuit substrate 7 is adhered with the adhesive 8 and molded by the sealing resin 4, separation of the adhesive by heat stress due to the difference in linear expansion coefficient between the mutual members is prevented.

Figure 58:
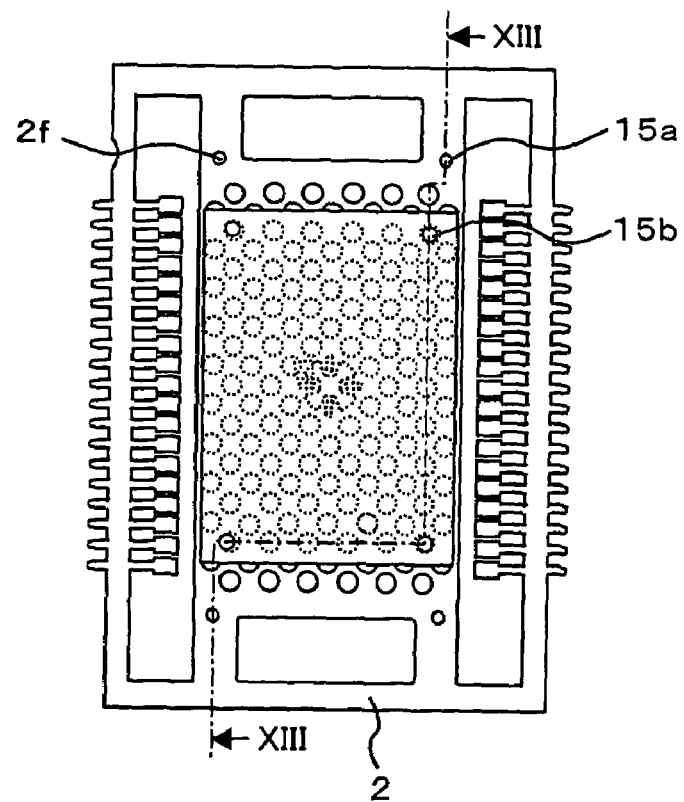
FIG. 58 is a plan view showing an example of the jig for adhering the circuit substrate.
Figure 59:
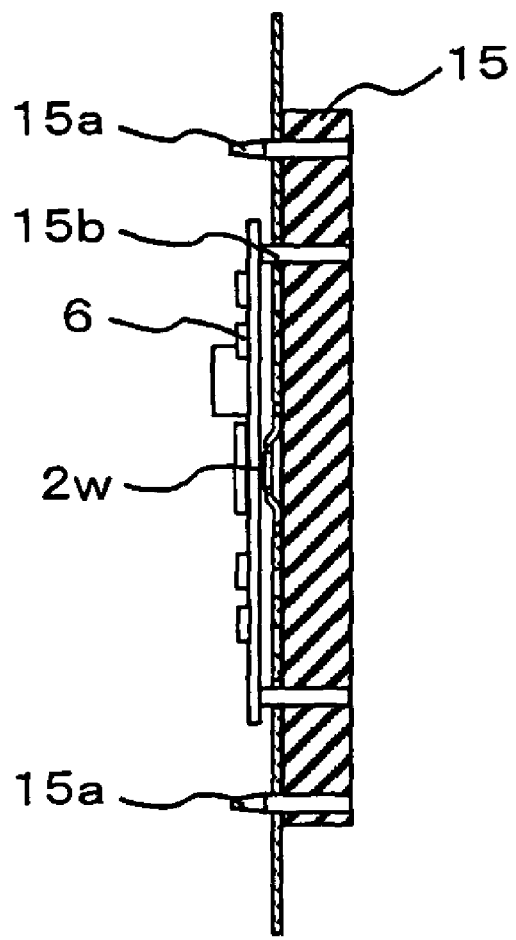
FIG. 59 is a plan view showing the jig for adhering the circuit substrate and the embodiment of the adhering operation.

FIG. 58 is a plan view showing an example of a jig for adhering the circuit substrate 7 and FIG. 59 is a cross sectional view of the jig along the line XIII—XIII.

When the lead frame unit 23 is positioned on an adhering pin 15 and is released, pins 15a pass through the positioning holes 2f. Next, pins 15b pass through a part of many small holes 2g formed in the lead frame unit 23 and the bottom of the lead frame unit 23 makes contact with the top of the adhering jig 15.

In this case, two pins 15a are provided. However, four pins 15a may be used so as to pass through all the four positioning holes 2f.

Thereafter, the adhesive 7 is coated in the adhering region 2s of the lead frame unit 23. Then, when the circuit substrate 7 is loaded, it is stopped in contact with the heads of the pins 15b. Four pins 15b are provided in this embodiment so as to be positioned in the four corners of the circuit substrate 7. The adhesive 8 may be coated before loading the circuit substrate 7 on the adhering jig 15.

When a load is applied to a part of the top of the circuit substrate 7 and simultaneously moved slightly back and forth in the plane direction, the adhesive 8 can effectively get to fit to the circuit substrate 7 and the adhering region 2s. Further, the positioning of the circuit substrate 7 in the plane direction is not shown in the drawing. However, it can be easily structured by providing pins in an optional shape passing through the small pins 2g.

On the adhering jig 15, many pins 15a and 15b are provided and prepared so as to simultaneously adhere many circuit substrates 7. After a predetermined time at a predetermined temperature, the curing of the adhesive 7 is completed.

Figure 60:
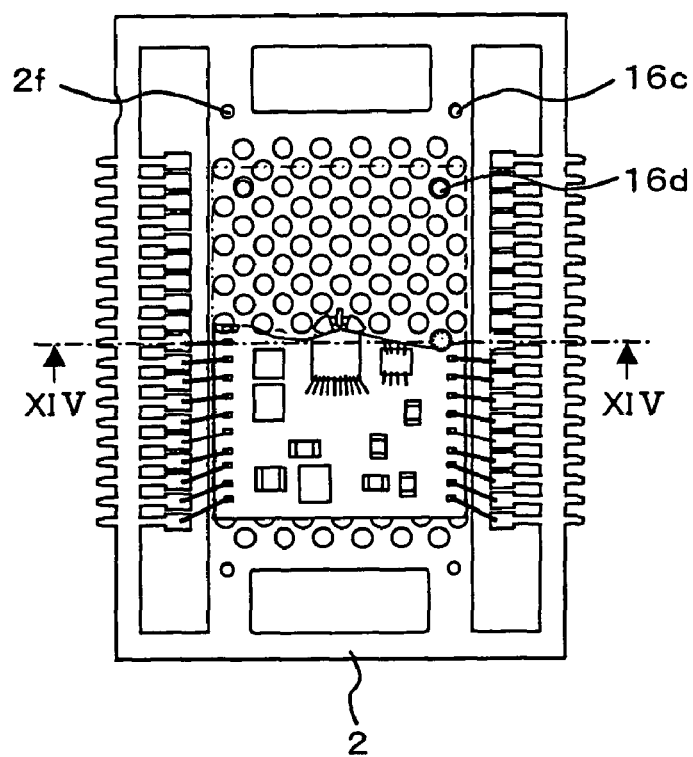
FIG. 60 is a plan view showing the jig for the wire bonding operation.
Figure 61:
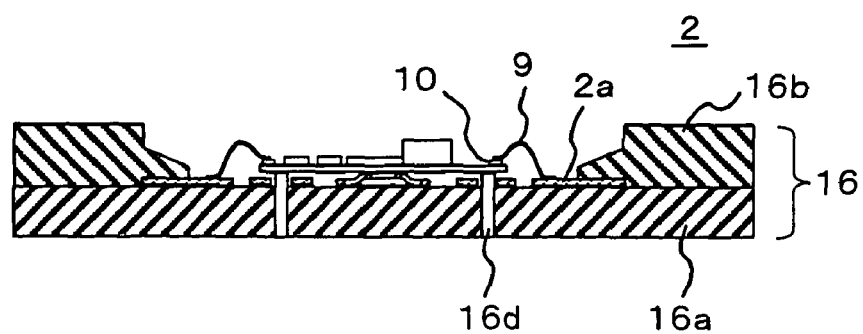
FIG. 61 is a cross sectional view along the line XIV—XIV shown in FIG. 60.

FIG. 60 is a plan view showing the jig for the wire bonding operation and FIG. 61 is a cross sectional view of the jig along the line XIV—XIV shown in FIG. 60.

The assembly after ending of the adhesive curing process is loaded on the lower jig 16a of the wire bonding jig 16. Firstly, when the pins 16c pass through the positioning holes 2f of the lead frame unit 23, the bottom of the lead frame unit 23 makes contact with the top of the lower jig 16a. Next, the lead frame unit 23 and the lead terminals 3a are pressed down by the upper jig 16b and using a clamp jig not shown in the drawing, the two are fixed not to move vertically and in the plane direction.

Thereafter, so as to make the heads of the pins 16d contact with the bottom of the circuit substrate 7, the pins 16d are pushed up. By combination of the lock mechanism, the pins 16d can be easily stopped at the position. Six pins 16d in total (not shown in the drawing) are provided in the four corners of the circuit substrate 7 and the two locations on the bottom thereof in the neighborhood of the bonding pads 9.

In the wire bonding operation, by the bonding capillaries through which the thin wires 9 pass, the circuit substrate 7 is pressed down by a load of several hundreds grams. However, the circuit substrate 7 is supported by the pins 16d, so that the circuit substrate 7 is prevented from deformation due to the pressing load.

The wire bonding operation uses an optional method such as thermal contact bonding or ultrasonic waves and electrically connects between the bonding pads 10 and the lead terminals 3a of the circuit substrate 7 by the thin aluminum wires 9.

In the adhering operation and wire bonding operation aforementioned, to simplify the jigs, for example, it may be considered to provide small projections on the top of the lead frame unit 23 so as to support the four corners of the circuit substrate 7.

Figure 62:
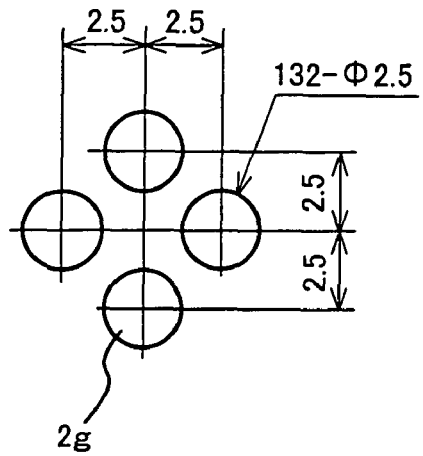
FIG. 62 is a detailed diagram showing concrete dimensions of the small holes of the lead frame.

However, as described later, it is found that due to repetitive heat stress, separation of the boundary surface between the sealing resin 4 and the lead frame unit 23 in the neighborhood of the projections develops greatly. Therefore, use of the aforementioned jigs without providing the support is necessary from the viewpoint of separation prevention. FIG. 62 is a detailed diagram of the small holes 2g of the lead frame unit 23.

Figure 63:
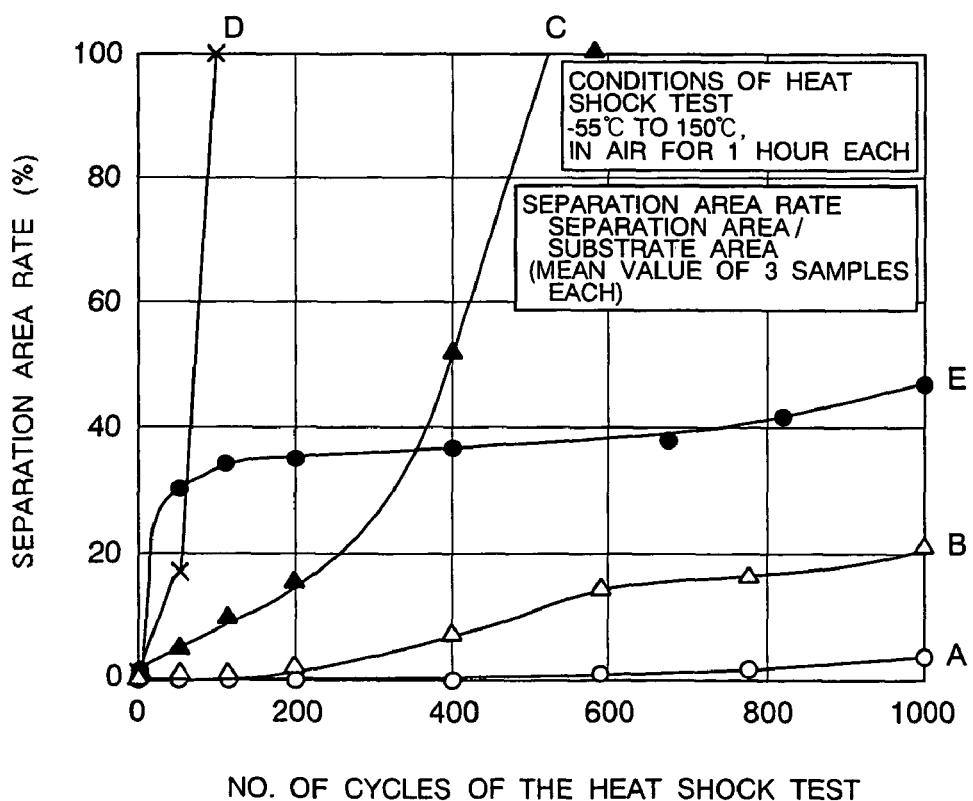
FIG. 63 is graphs showing measured results of the boundary separation development degree when the heat shock test is executed.
Figure 64:
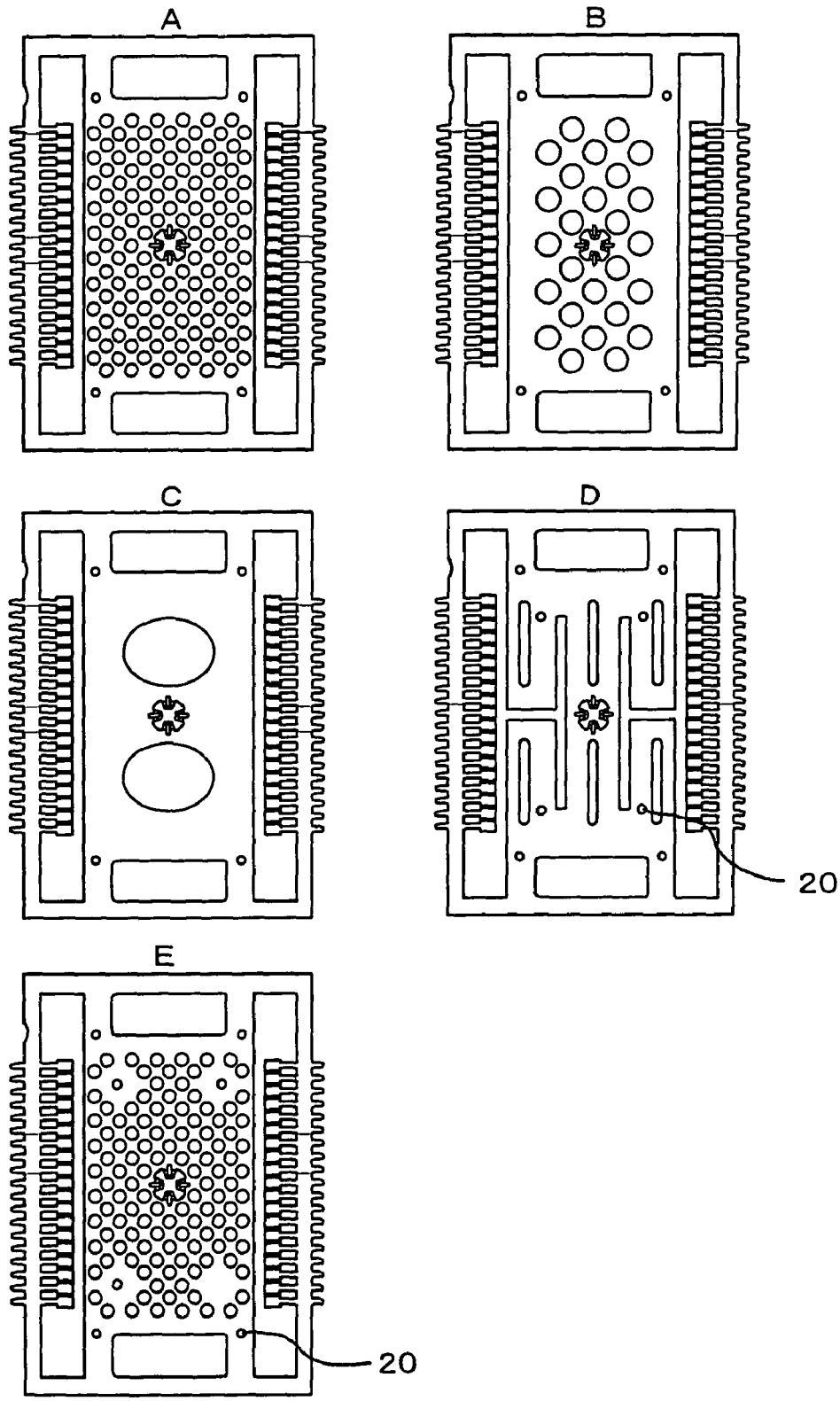
FIG. 64 is plan view showing the shapes of the lead frame of samples for which the heat shock test is executed.
Figure 65:
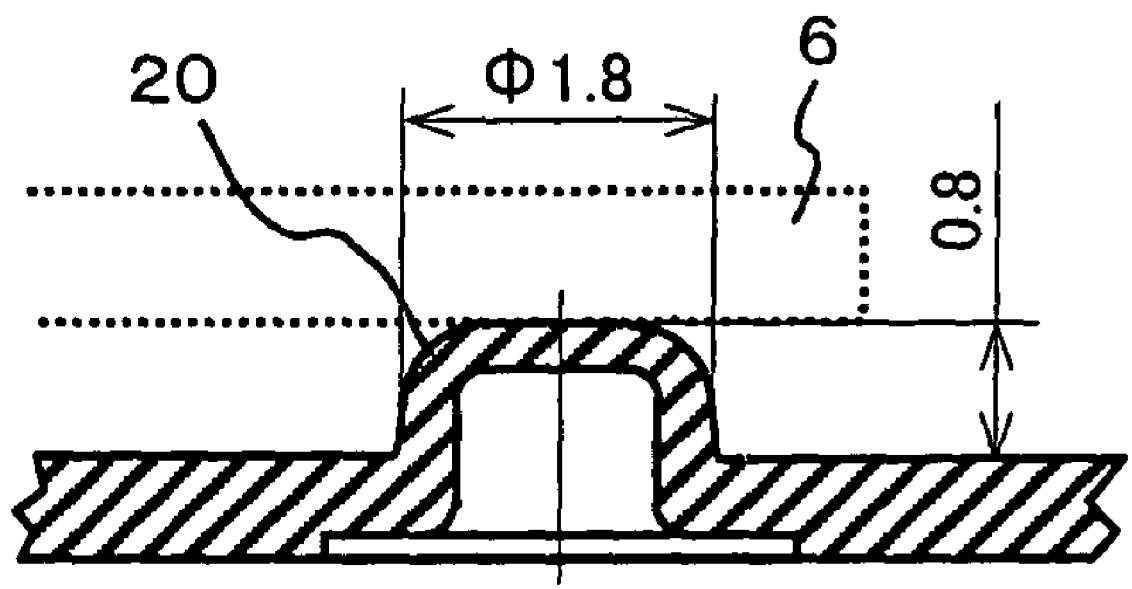
FIG. 65 is a drawing showing the dimensions of the four-corner support of the substrate of the samples D and E.

FIG. 63 is graphs showing comparison results of the development degree of generation of boundary separation in the heat shock test conducted for the forming parts of holes different in shape from the small holes 2g of the lead frame unit 23 with that of the structure of the present invention. The separation position is shown in FIG. 54. Further, the respective lead frame shapes are shown in FIG. 64 and the dimensions of the supports of the four corners of the substrate are shown in FIG. 65. The specification for samples is indicated in Table 1.

TABLE 1

Specification for test sample

| No. of holes | Lead frame shape | Existence of four-corner supports of substrate |
|---|---|---|
| 132 | FIG. 64 (A) | No |
| 26 | FIG. 64 (B) | No |
| 2 | FIG. 64 (C) | No |
| 10 | FIG. 64 (D) | Yes |
| 116 | FIG. 64 (E) | Yes |

Common conditions
(1) Material of lead frame: Copper alloy, thickness of 0.64 mm, linear expansion coefficient of 17.5 ppm/° C.
(2) Material of sealing resin: Epoxy, linear expansion coefficient of 12 ppm/° C.
(3) Material of circuit substrate: High-temperature calcined multilayer ceramics, thickness of 0.8 mm, linear expansion

| Symbol | Lead frame hole (mm) |
|---|---|
| A | Small hole, Φ 2.5 |
| B | Medium hole, Φ 5 |
| C | Ellipse, 9 × 18 |
| D | Slit, 2 in width |
| E | Small hole, Φ 2.5 |

Separation is confirmed by a method using an ultrasonic flaw detection imaging device. The method immerses a measuring object in water, focuses an ultrasonic detector on the part to be measured, applies ultrasonic waves to it, performs a predetermined signal process from the physical properties of the member and the time required for return of reflected waves thereof, and decides existence of separation.

The time required for return of reflected waves is different between existence of separation and non-existence of separation and by scanning the overall projection face of an object, the non-separated part and separated part can be discriminated by color display.

The separation area rate is a percent ratio of the separation area to the substrate area and the mean value of each 3 samples is indicated.

The separation parts, as shown in FIG. 54, are all the boundary surface between the sealing resin 4 under the circuit substrate 7 and the top of the lead frame unit 23.

The samples A of the structure of this embodiment show very little separation development. In the samples under the other specifications, although no separation is generated in the early stage, as the number of cycles is increased, separation is generated and is slowly enlarged and developed. Particularly in the samples D, 100% of separation is generated in a short number of cycles.

In the samples D, there are many slits formed, so that the rigidity is lower than that of the samples C. Nevertheless, the reason of sudden development of separation is considered as that there is a slit in the central part where the boundary surface stress is maximum and when the tongue-shaped part is separated, the separation develops starting from it due to repetitive heat stress.

In the samples B, the separation area is about 20% at the point of time of 1000 cycles, and although it is worse than 5% of the small holes of this embodiment, it is a practically allowable level. Thereby, it is found that by installation of many small holes, a separation prevention effect can be obtained.

In the samples C, the separation suddenly develops from more than 200 cycles and reaches 100% at about 500 cycles. When 2 large holes are provided, the rigidity is higher than that of the samples A, so that in short cycles, although the adhesion is maintained to a certain extent, when separation is generated, the separation is considered to develop starting from it.

In the samples E, the separation is concentrated in the neighborhood of the four-corner supports 20 of the substrate. However, after more than 50 cycles, the development degrees is slow changing. Although the samples E have many small holes, the separation develops due existence of the substrate supports 20. The reason will be explained hereunder.

The substrate supports 20 are formed by press-drawing a part of the lead frame unit 23. However, it is considered that a locally highly rigid region is formed including the neighboring flat part, so that the substrate supports 20 cannot absorb heat stress changes acting on the boundary surface with the sealing resin 4, thus separation is generated. The reason that even if the number of cycles increases, the separation development degree is low is that the stress is released in correspondence with separation and the rigidity of the lead frame unit 23 is reduced due to existence of many small holes.

As the diameter of the small holes 2*g* is decreased and the number thereof is increased, dispersion of heat stress can be expected. However, a problem arises that when the sealing resin 4 flows during transfer molding, it pushes air existing in the small holes 2*g* aside and when resin is to be filled up, air is not ejected smoothly.

When the ejection is incomplete, if a thin air film is formed in the neighborhood of the lead frame unit 23, initial separation appears. Further, when the distance between neighboring holes is shorter than the thickness of the lead frame unit 23, the press-cutting quality is low, so that the hole diameter and number of holes are limited.

The experimental results show that when the hole diameter is 1.5 mm and the number of holes is 314, 5 samples formed all generate no initial separation. Further, when the hole diameter is 1 mm and the number of holes is 473, 2 samples among five samples generate separation. As a result, a hole diameter of 1.5 mm or more and a number of holes of 314 or less, furthermore, in accordance with the results of the samples B, a hole diameter of 5 mm or less and a number of holes of 26 or more are considered as optimal conditions.

The experimental results are ones obtained when the size of the circuit substrate 7 is 35 mm×46 mm and they are expressed as indicated below by converting by the number of holes per a substrate area of 10 cm$^2$.

Substrate area=35×46=1610 mm$^2$=16.1 cm$^2$

No. of holes per a substrate area of 10 cm$^2$=(26 to 314)/16.1=1.6 to 195 each

Therefore, when the size of the sealing resin 4 and the size of the circuit substrate 7 are changed, if the size and number of small holes 2*g* to be formed in the lead frame unit 23 are decided by application of the aforementioned converted values, an epoxy resin sealing package free of generation of boundary surface separation can be constituted.

Reference signs show the following parts in the drawings.

1: Electronic circuit device, 2: Base, 2': Substrate adhering part, 2*d*: Flange, 2*e*: Base joint, 2*f*: Positioning hole, 2*g*: Small hole, 2*h*: Stopper, 2*i*: Projection, 2*j*: substrate positioning hole, 2*k*: Slit, 2*m*: Window, 2*n*: Projection, 2*p*: Window, 2*q*: Narrow small window, 2*r*: Inclined part, 2*s*: Adhering part extending horizontally, 2*w*: Adhering part, 3: Lead frame, 3*a*: Lead terminal, 3*b*: Bonding pad, 3*c*: Inter-terminal connection, 3*d*: Frame, 3*e*: Connection, 3*f*: Lead frame joint, 3*g*: Feed hole, 3*s*: Stress absorber, 4: Sealing resin, 5: Electronic circuit assembly, 6: Circuit element, 7: Circuit substrate, 7*a*: Trimming pattern, 8: Adhesive, 8': Adhering sheet, 9: Thin aluminum wire, 23: Lead frame unit.

According to the present invention, an inexpensive electronic circuit device for car use free of separation of the boundary surfaces of mold resin with the circuit substrate, base, and lead frame and cracking of the resin due to heat stress can be realized.

What is claimed is:

1. An electronic circuit device comprising:
   an electronic circuit assembly including a circuit substrate having circuit patterns to which electronic circuit elements including a semiconductor chip are attached;
   a base having a flange with an opening, said electronic circuit assembly being adhered to the base, wherein the flange extends outwardly from the connecting portion of the base and the electronic circuit assembly; and
   lead terminals made of a different member from said base and a material having a thermal expansion coefficient larger than that of said base, which are electrically connected to said electronic circuit assembly, wherein said electronic circuit assembly, said lead terminals, and said flange are molded as one body with a molding resin, except for parts of the flange and lead terminals, so that the opening of the flange and part of the lead terminals are exposed.

* * * * *